US008760182B2

(12) United States Patent
Wood et al.

(10) Patent No.: US 8,760,182 B2
(45) Date of Patent: Jun. 24, 2014

(54) TEST HEAD DOCKING SYSTEM AND METHOD WITH SLIDING LINKAGE

(75) Inventors: James B. Wood, Voorhees, NJ (US); Bryan M. Porch, Cherry Hill, NJ (US)

(73) Assignee: inTEST Corporation, Mt. Laurel, NJ (US)

( * ) Notice: Subject to any disclaimer, the term of this patent is extended or adjusted under 35 U.S.C. 154(b) by 560 days.

(21) Appl. No.: 13/003,660

(22) PCT Filed: Jul. 10, 2009

(86) PCT No.: PCT/US2009/050236
§ 371 (c)(1),
(2), (4) Date: Apr. 25, 2011

(87) PCT Pub. No.: WO2010/009013
PCT Pub. Date: Jan. 21, 2010

(65) Prior Publication Data
US 2011/0305501 A1    Dec. 15, 2011

Related U.S. Application Data

(60) Provisional application No. 61/080,313, filed on Jul. 14, 2008.

(51) Int. Cl.
*G01R 31/00*    (2006.01)
*G01R 31/20*    (2006.01)

(52) U.S. Cl.
USPC ................................ 324/750.16; 324/750.25

(58) Field of Classification Search
None
See application file for complete search history.

(56) References Cited

U.S. PATENT DOCUMENTS

| 4,527,942 | A | 7/1985 | Smith | |
|---|---|---|---|---|
| 6,617,867 | B2 * | 9/2003 | Bruno et al. | 324/750.25 |
| 7,109,733 | B2 | 9/2006 | Gudin et al. | |
| 7,276,895 | B2 * | 10/2007 | Mueller | 324/750.19 |
| 7,598,725 | B2 * | 10/2009 | Bosy et al. | 324/750.24 |
| 2002/0063558 | A1 | 5/2002 | Takeuchi et al. | |
| 2004/0239353 | A1 | 12/2004 | Gudin et al. | |

FOREIGN PATENT DOCUMENTS

| CN | 1539083 A | 10/2004 |
|---|---|---|
| JP | 05-126903 A | 5/1993 |
| JP | 2002-168906 A | 6/2002 |
| JP | 2004-536311 A | 12/2004 |
| KR | 10-2006-0062244 A | 6/2006 |
| KR | 10-2007-0075756 A | 7/2007 |

OTHER PUBLICATIONS

International Search Report for International Application No. PCT/US2009/050236, Dec. 18, 2009, Korean Intellectual Property Office.
Chinese Office Action issued in corresponding Chinese Patent Application No. 200980135954.0, mailed on Oct. 17, 2012.
Notice of Reasons for Rejection for Patent Application No. 2011-518806, dated Jun. 18, 2013.

* cited by examiner

*Primary Examiner* — Vinh Nguyen
(74) *Attorney, Agent, or Firm* — RatnerPrestia

(57) ABSTRACT

A system for docking an electronic test head with a handling apparatus is provided. The system includes an assembly for at least partially aligning and subsequently bringing together the electronic test head and the handling apparatus. The system includes a power driven actuator for powered bringing together of the electronic test head and the handling apparatus.

20 Claims, 22 Drawing Sheets

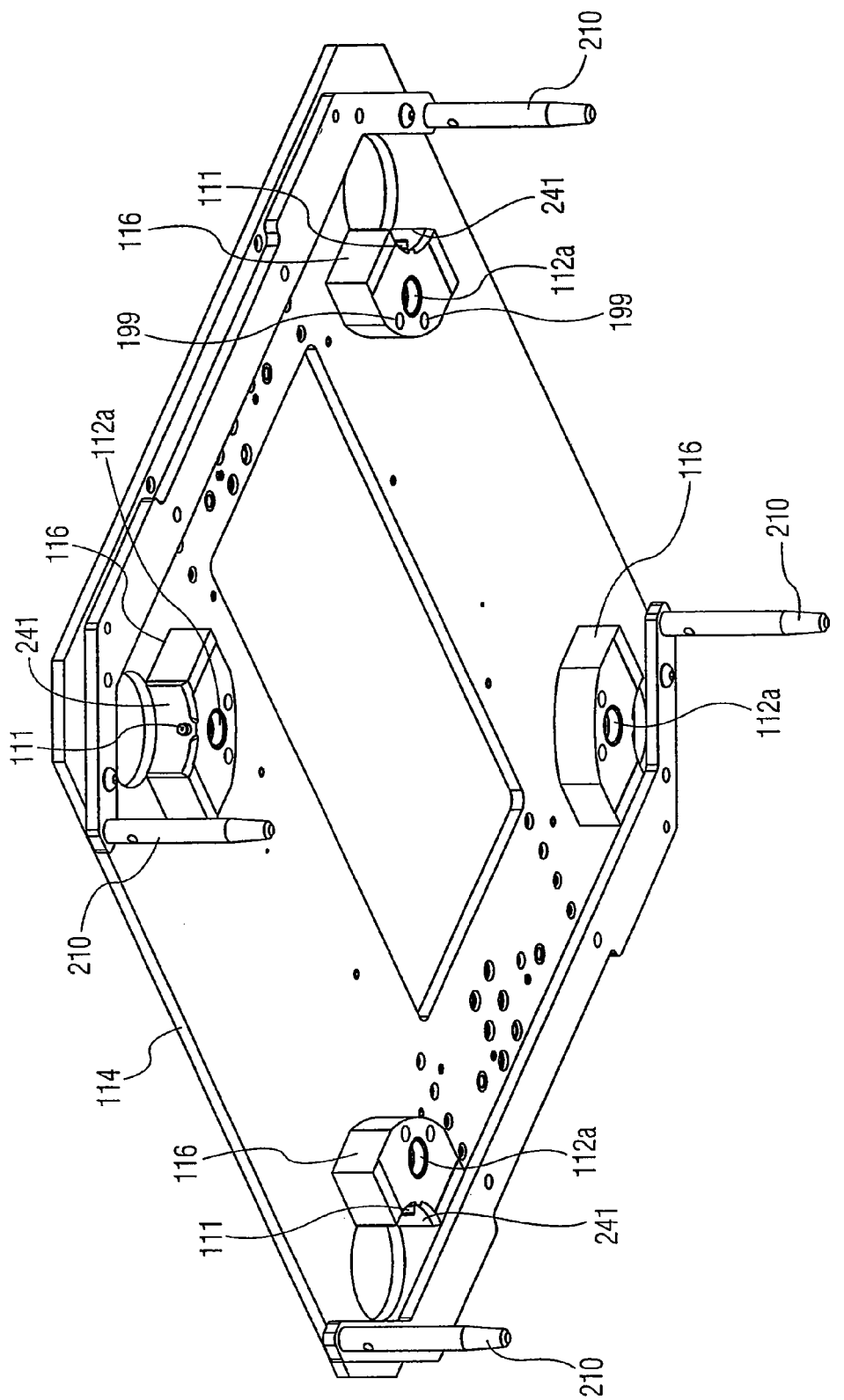

TEST HEAD DOCKING SYSTEM AND METHOD WITH SLIDING LINKAGE

FIELD OF THE INVENTION

This invention relates to the field of electronic test head docking, and more specifically to a method and apparatus for test head docking using cams powered by one or more actuators for docking actuation.

BACKGROUND OF THE INVENTION

In the manufacture of integrated circuits (ICs) and other electronic devices, testing with automatic test equipment (ATE) is performed at one or more stages of the overall process. Special handling apparatus is used which places the device to be tested into position for testing. In some cases, the special handling apparatus may also bring the device to be tested to the proper temperature and/or maintain it at the proper temperature as it is being tested. The special handling apparatus is of various types including "probers" for testing unpackaged devices on a wafer and "device handlers" for testing packaged parts; herein, the terms "handling apparatus" or "peripherals" will be used to refer to all types of such apparatus. The electronic testing itself is provided by a large and expensive ATE system which includes a test head which is required to connect to and dock with the handling apparatus. The Device Under Test (DUT) requires precision, high-speed signals for effective testing; accordingly, the "test electronics" within the ATE which are used to test the DUT are typically located in the test head which must be positioned as close as possible to the DUT. The test head is extremely heavy, and as DUTs become increasingly complex with increasing numbers of electrical connections, the size and weight of test heads have grown from a few hundred pounds to presently as much as two or three thousand pounds. The test head is typically connected to the ATE's stationary mainframe by means of a cable, which provides conductive paths for signals, grounds, and electrical power. In addition, the test head may require liquid coolant to be supplied to it by way of flexible tubing, which is often bundled within the cable. Further, certain contemporary test heads are cooled by air blown in through flexible ducts or by a combination of both liquid coolants and air. In the past, test systems usually included a mainframe housing power supplies instruments, control computers and the like. Electrical cables coupled the mainframe electronics to "pin electronics" contained in the test head. Several contemporary systems now place virtually all of the electronics in the movable test head while a mainframe may still be employed to house cooling apparatus, power supplies, and the like.

In testing complex devices, hundreds or thousands of electrical connections have to be established between the test head and the DUT. These connections are accomplished with delicate, densely spaced contacts. In testing unpackaged devices on a wafer, the actual connection to the DUT is typically achieved with needle-like probes mounted on a probe card. In testing packaged devices, it is typical to use a test socket mounted on a "DUT board." In either case, the probe card or DUT board is usually fixed appropriately to the handling apparatus, which brings each of a number of DUTs in turn into position for testing. In either case the probe card or DUT board also provides connection points with which the test head can make corresponding electrical connections. The test head is typically equipped with an interface unit that includes contact elements to achieve the connections with the probe card or DUT board. Typically, the contact elements are spring loaded "pogo pins." Overall, the contacts are very fragile and delicate, and they must be protected from damage.

Test head manipulators may be used to maneuver the test head with respect to the handling apparatus. Such maneuvering may be over relatively substantial distances on the order of one meter or more. The goal is to be able to quickly change from one handling apparatus to another or to move the test head away from the present handling apparatus for service and/or for changing interface components. When the test head is held in a position with respect to the handling apparatus such that all of the connections between the test head and probe card or DUT board have been achieved, the test head is said to be "docked" to the handling apparatus. In order for successful docking to occur, the test head must be precisely positioned in six degrees of freedom with respect to a Cartesian coordinate system. Most often, a test head manipulator is used to maneuver the test head into a first position of coarse alignment within approximately a few centimeters of the docked position, and a "docking apparatus" is then used to achieve the final precise positioning. Typically, a portion of the docking apparatus is disposed on the test head and the rest of it is disposed on the handling apparatus. Because one test head may serve a number of handling apparatuses, it is usually preferred to put the more expensive portions of the docking apparatus on the test head. The docking apparatus may include an actuator mechanism which draws the two segments of the dock together, thus docking the test head; this is referred to as "actuator driven" docking. The docking apparatus, or "dock" has numerous important functions, including: (1) alignment of the test head with the handling apparatus, (2) pulling together, and later separating, the test head and the handling apparatus, (3) providing pre-alignment protection for electrical contacts, and (4) latching or holding the test head and the handling apparatus together.

According to the inTEST Handbook ($5^{th}$ Edition © 1996, inTEST Corporation), "Test head positioning" refers to the easy movement of a test head to a handling apparatus combined with the precise alignment to the handling apparatus required for successful docking and undocking. A test head manipulator may also be referred to as a test head positioner. A test head manipulator combined with an appropriate docking means performs test head positioning. This technology is described, for example, in the aforementioned inTEST Handbook. This technology is also described, for example, in U.S. Pat. Nos. 5,608,334, 5,450,766, 5,030,869, 4,893,074, 4,715,574, and 4,589,815, which are all incorporated by reference for their teachings in the field of test head positioning systems. The foregoing patents relate primarily to actuator driven docking. Test head positioning systems are also known where a single apparatus provides both relatively large distance maneuvering of the test head and final precise docking. For example, U.S. Pat. No. 6,057,695, Holt et al., and U.S. Pat. Nos. 5,900,737 and 5,600,258, Graham et al., which are all incorporated by reference, describe a positioning system where docking is "manipulator driven" rather than actuator driven. However, actuator driven systems are the most widely used, and the present invention is directed towards them.

In the typical actuator driven positioning system, an operator controls the movement of the manipulator to maneuver the test head from one location to another. This may be accomplished manually by the operator exerting force directly on the test head in systems where the test head is fully balanced in its motion axes, or it may be accomplished through the use of actuators directly controlled by the operator. In several contemporary systems, the test head is maneuvered by a combination of direct manual force in some axes and by actuators in other axes.

In order to dock the test head with the handling apparatus, the operator must first maneuver the test head to a "ready to dock" position, which is close to and in approximate alignment with its final docked position. The test head is further maneuvered until it is in a "ready to actuate" position where the docking actuator can take over control of the test head's motion. The actuator can then draw the test head into its final, fully docked position. In doing so, various alignment features provide final alignment of the test head. A dock may use two or more sets of alignment features of different types to provide different stages of alignment, from initial to final. It is generally preferred that the test head be aligned in five degrees of freedom before the fragile electrical contacts make mechanical contact. The test head may then be urged along a straight line, which corresponds to the sixth degree of freedom, that is normal to the plane of the interface (typically the plane of the probe card or DUT board); and the contacts will make connection without any sideways scrubbing or forces which can be damaging to them.

As the docking actuator is operating, the test head is typically free to move compliantly in several if not all of its axes to allow final alignment and positioning. For manipulator axes which are appropriately balanced and not actuator driven, this is not a problem. However, actuator driven axes generally require that compliance mechanisms be built into them. Some typical examples are described in U.S. Pat. No. 5,931,048 to Slocum et al and U.S. Pat. No. 5,949,002 to Alden. Often compliance mechanisms, particularly for non-horizontal unbalanced axes, involve spring-like mechanisms, which in addition to compliance add a certain amount of resilience or "bounce back." Further, the cable connecting the test head with the ATE mainframe is also resilient. As the operator is attempting to maneuver the test head into approximate alignment and into a position where it can be captured by the docking mechanism, he or she must overcome the resilience of the system, which can often be difficult in the case of very large and heavy test heads. Also, if the operator releases the force applied to the test head before the docking mechanism is appropriately engaged, the resilience of the compliance mechanisms may cause the test head to move away from the dock. This is sometimes referred to as a bounce back effect.

U.S. Pat. No. 4,589,815, to Smith, discloses a prior art docking mechanism. The docking mechanism illustrated in FIGS. 5A, 5B, and 5C of the '815 patent uses two guide pin and hole combinations to provide final alignment and two circular cams. When the cams are rotated by handles attached to them, the two halves of the dock are pulled together with the guide pins becoming fully inserted into their mating holes. A wire cable links the two cams so that they rotate in synchronism. The cable arrangement enables the dock to be operated by applying force to just one or the other of the two handles. The handles are accordingly the docking actuator in this case.

The basic idea of the '815 dock has evolved as test heads have become larger into docks having three or four sets of guide pins and circular cams interconnected by cables. FIGS. 1A, 1B, 1C, and 1D of the present application illustrate a prior art dock having four guide-pin and hole combinations and four circular cams, which is described in more detail later. Although such four point docks have been constructed having an actuator handle attached to each of the four cams, the dock shown incorporates a single actuator handle that operates a cable driver. When the cable driver is rotated by the handle, the cable is moved so that the four cams rotate in a synchronized fashion. This arrangement places a single actuator handle in a convenient location for the operator. Also, greater mechanical advantage can be achieved by appropriately adjusting the ratio of the diameters of the cams to the diameter of the cable driver.

The docks described in U.S. Pat. Nos. 5,654,631 and 5,744,974 utilize guide pins and holes to align the two halves. However, the docks are actuated by vacuum devices, which urge the two halves together when vacuum is applied. The two halves remain locked together so long as the vacuum is maintained. However, the amount of force that can be generated by a vacuum device is limited to the atmospheric air pressure multiplied by the effective area. Thus, such docks are limited in their application.

The docks disclosed in U.S. Pat. Nos. 5,821,764, 5,982,182, and 6,104,202 use other techniques, such as kinematic couplings, to provide the final alignment between the two halves. Coarse alignment pins may also be utilized to provide an initial alignment. The coarse alignment pins may be provided with a catch mechanism, which captures the guide pin in its hole and prevents it from escaping. The catch mechanism appears to activate automatically in the '764 and '202 patents; whereas, a motor driven device is utilized for each of the three coarse alignment pins in the '182 patent. Also in the '182 patent the three motors may be operated separately to effect planarization between the docked components. In all three patents, a linear actuator is used to finally pull the two halves together. The linear actuator is disclosed as being of the pneumatic type. In docks of this type, it is necessary that another mechanism be used to provide enough pre-alignment to prevent damage to the fragile electrical contacts. For this reason the aforementioned coarse alignment pins are used, which adds to the overall cost and complexity. Thus, two sets of alignment features are provided, namely: (1) coarse alignment pin-hole combinations, and (2) a kinematic coupling. The cam-actuated docks, mentioned previously and to be described next, combine pre-alignment with gussets and cams, precision alignment with guide pins and receptacles, and mechanical advantage and locking with cams and cam followers, in three simple mechanisms. It would be desirable to retain this simplicity and proven techniques in a powered dock for large test heads.

More specifically, with regards to kinematic couplings, the '182 patent discloses that the combination of a ball and groove is termed a "kinematic contact" because such a combination provides some of the contacts needed to form the kinematic coupling. Each side of a groove is termed a "kinematic surface" because it provides for contact at a single point. The ball is called a "kinematic mating surface" because it contacts a kinematic surface at only one point. For satisfactory operation of a kinematic coupling, the '182 patent indicates that it is not necessary that grooves be used to form the kinematic surfaces. Other shapes, such as a gothic arch, can be used as well. It is also not necessary that a ball be used as the kinematic mating surface. Other shapes, such as the tip of a cone, can be made to contact a surface at a single point. Likewise, it is not necessary that each kinematic contact include two kinematic surfaces. Examples of other suitable kinematic contacts are: a ball pressing against a flat surface (one kinematic surface per contact); a ball pressing against a tetrahedron (three kinematic surfaces per contact) or a ball pressing against three balls (three kinematic surfaces per contact). Different types of contacts may be used in one coupling as long as there are six kinematic surfaces in total.

Selected details of the construction and operation of the prior art dock illustrated in FIGS. 1A through 1D are herein described. This description includes aspects from an earlier docking apparatus described in U.S. Pat. No. 4,589,815, which is incorporated by reference.

FIG. 1A shows in perspective a test head 100 held in a cradle 190, which is in turn supported by a test head manipulator (not shown). Also shown is a cut away segment of a handler apparatus 108 to which the test head 100 may be docked. FIG. 1B shows device handler 108 in somewhat larger scale and greater detail. (In this particular example the handler apparatus is a packaged device handler, and the test head is docked to it from below.) Briefly looking ahead to the sectional view in FIG. 1C, it is seen that the test head 100 has electrical interface 126, and the handler apparatus 108 has a corresponding electrical interface 128. Electrical interfaces 126 and 128 typically have hundreds or thousands of tiny, fragile electrical contacts (not shown) that must be precisely engaged in a manner to provide reliable corresponding individual electrical connections when the test head is finally docked. As is shown in this exemplary case, the lower surface of handler apparatus 108 contains the handler electrical interface 128, and the test head 100 is docked with a generally upward motion from below. Other orientations are possible and known including, but not limited to: docking to a top surface with a downward motion, to a vertical plane surface with horizontal motion, and to a plane that is at an angle to both the horizontal and vertical.

Returning to FIGS. 1A and 1B, the complete four point docking apparatus is shown; portions of it are attached either to the handler apparatus 108 or to the test head 100. Attached to test head 100 is faceplate 106. Four guide pins 112 are attached to and located near the four corners of faceplate 106. Face plate 106 has a central opening and is attached to test head 100 so that the test head electrical interface 126 (not shown in FIGS. 1A and 1B) projects through the opening and guide pins 112 define an approximate rectangle that has an approximate common center with electrical interface 126.

Gusset plate 114 is attached to the lower surface of the handler apparatus 108. Gusset plate 114 has a central opening and is attached to handler apparatus 108 so that the handler electrical interface 128 projects through the opening. Four gussets 116 are attached to gusset plate 114, one located near each of its four corners. Each gusset 116 has a guide pin hole or receptacle 112a bored in it. Each guide pin hole 112a corresponds to a respective guide pin 112. These are arranged so that when the test head is fully docked, each guide pin 112 will be fully inserted into its respective guide pin hole 112a. The fit of each guide pin 112 in its corresponding hole 112a is a close fit. Thus, the guide pins 112 and guide pin holes 112a provide alignment between the test head 100 and the handler apparatus 108.

Four docking cams 110 are rotatably attached to the face plate 106. Cams 110 are circular and are similar to those described in the '815 patent. In particular each has a side helical groove 129 around its circumference with an upper cutout 125 on the upper face. Each docking cam 110 is located in proximity to a respective guide pin 112 such that it is generally centered on a line extending approximately from the center of the test head electrical interface 126 through the respective guide pin 112 such that guide pin 112 lies between cam 110 and the test head electrical interface 126. The gussets 116 and the corners of the gusset plate 114 have circular cutouts such that when the guide pins 112 are fully inserted into guide pin holes 112a in the gussets, the circumference of each cam 110 is adjacent to and concentric with the circular cutout in its respective gusset 116. This arrangement provides an initial course alignment between the docking components as the test head 100 is first maneuvered into position for docking with handler apparatus 108. Initial coarse alignment may also be provided by the tapered ends of guide pins 112 entering their respective receptacles 112a. The gussets 116, cams 110, and guide pins 112 are arranged so that handler electrical interface 128 is kept separated from test head electrical interface 126 (not shown in FIGS. 1A and 1B) until the guide pins 112 are actually received in their respective guide pin holes 112a. Thus, pre-alignment protection is provided to the electrical contacts.

Thus, two sets of alignment features are provided, namely: (1) the fit of gussets 116 with respect to cams 110, and (2) the guide pin 112 and receptacle 112a combinations.

A circular cable driver 132 with an attached docking handle 135 is also rotatably attached to face plate 106. Docking cable 115 is attached to each of the cams 110, and to cable driver 132. Pulleys 137 appropriately direct the path of the cable to and from cable driver 132. Cable driver 132 can be rotated by means of applying force to handle 135. As cable driver 132 rotates it transfers force to cable 115 which in turn causes cams 110 to rotate in synchronism.

Extending from the circular cutout of each gusset 116 is a cam follower 111. Cam follower 111 fits into the upper cutout on the upper face of its respective cam 110. FIG. 1C shows in cross section one stage in the process of docking test head 100 with handler apparatus 108. Here guide pins 112 are partially inserted into guide pin holes 112a in gussets 116. It is noted that in this exemplary case, guide pins 112 are tapered near their distal ends and are of constant diameter nearer to their point of attachment to face plate 106. In FIG. 1C guide pins 112 have been inserted into guide pin holes 112a to a point where the region of constant diameter is just entering the guide pin holes 112a. Also in FIG. 1C, each cam follower 111 has been inserted into the upper cutout 125 on the upper face of its respective cam 110 to a depth where it is at the uppermost end of the helical cam groove 129. In this configuration, the dock is ready to be actuated by applying force to the handle 135 (not shown in FIG. 1C) and rotating the cams 110. Accordingly, this configuration may be referred to as the "ready to actuate" position. It is important to note that in this position, alignment in five degrees of freedom has been achieved. In particular, if the plane of the handler apparatus electrical interface 126 is the X-Y plane of three dimensional interface, guide pins 112 having their full diameter inserted into receptacles has established X, Y, and theta Z alignment. Furthermore, the insertion of cam followers 111 fully into all cut outs 125 has established planarization between the handler apparatus electrical interface 126 and the test head electrical interface 128.

FIG. 1D shows in cross section the result of fully rotating cams 110. The test head 100 is now "fully docked" with handler apparatus 108. It is seen that cams 110 have been rotated and have caused cam followers 111 to follow the helical grooves 129 to a point in closer proximity to faceplate 106. In addition, guide pins 112 are fully inserted into their respective guide pin holes 112a. It is observed that the closeness of the fit between the constant diameter region of guide pins 112 and the sides of the respective guide pin holes 112a determines the final alignment between the handler electrical interface 128 and the test head electrical interface 126. Accordingly, a close fit is generally required to provide repeatability of docked position within three to seven thousandths of an inch. Furthermore, the guide pins 112 must be precisely placed on face plate 106 with respect to the gussets once gusset plate 114 has been attached to handler apparatus 108. To facilitate this, the guide pins 112 may be attached in a manner that allows their position to be adjusted. A manner of doing this which is widely practiced is described in the '815 patent.

It is useful to review some information about the movement of the cam followers. FIG. 2 illustrates the vertical position of the cam follower 111 at various points of cam 110 motion. FIG. 2 applies to circular (or cylindrical) cams as well as to linear cams as used in certain docking apparatus manufactured by, for example, Reid Ashman Manufacturing Co. The shapes of the cam groove 129 and cut out 125 are schematically shown; FIG. 2 is not drawn to scale as its purpose is illustrative. The cut out area where the cam follower 111 can enter or exit the cam groove is indicated at point O. The cam follower 111 (illustrated as a dotted circle at various points in cam groove 129) enters the cut out 125 at position 400, and subsequently reaches position 410 corresponding to a "ready to actuate" position. The cut out area is connected to a generally horizontal region of groove 129 between points O and A. This horizontal region is generally one to two cam follower diameters in length (but may sometimes be less) and represents only a small portion (a few degrees) of the total cam motion. Once the cam follower 111 has been inserted to the bottom of the cut out 125, the cam may be rotated to "capture" the cam follower in this horizontal region. The cam follower 111 is "captured" at position 420. At point A the horizontal groove transitions to a sloping groove as the cam is moved further. As the cam is moved the cam follower is accordingly raised or lowered vertically. At point B at the lower end of the slope the groove transitions to a generally horizontal region that is typically at least one or two cam follower diameters long. In this latter region, the cam follower is at the extent of its travel, and the apparatus is fully docked. The apparatus is considered to be latched (or alternatively fully docked and locked) when the cam follower is at point C (illustrated with cam follower 111 at position 440), the furthest extent of the groove. The region from A to B may be referred to as the "midway" region (illustrated with cam follower 111 at position 430), and the region from B to C may be referred to as the docked region.

In light of the foregoing discussion, it is now appropriate to more fully discuss the docking process and define certain terms. The purpose of docking is to precisely mate the test head electrical interface 126 with the handler apparatus electrical interface 128. Each electrical interface 126 and 128 defines a plane, which is typically, but not necessarily, nominally parallel with the distal ends of the electrical contacts. When docked these two planes must be parallel with one another. In order to prevent damage to the electrical contacts, it is preferred to first align the two interfaces 126 and 128 in five degrees of freedom prior to allowing the electrical contacts to come into mechanical contact with one another. If in the docked position the defined planes of the interfaces are parallel with the X-Y plane of a three dimensional Cartesian coordinate system, alignment must occur in the X and Y axes and rotation about the Z axis (Theta Z), which is perpendicular to the X-Y plane, in order for the respective contacts to line up with one another. Additionally, the two planes are made parallel by rotational motions about the X and Y axes. The process of making the two electrical interface planes parallel with one another is called "planarization" of the interfaces; and when it has been accomplished, the interfaces are said to be "planarized" or "co-planar." Once planarized and aligned in X, Y and Theta Z, docking proceeds by causing motion in the Z direction perpendicular to the plane of the handler electrical interface 128. In the process of docking, test head 100 is first maneuvered into proximity of the handler 108. Further maneuvering brings the circular cutouts of the gussets 116 into a first alignment with the cams 110. This position, or one just prior to it, may be considered to be a "ready to dock" position. More generally, "ready to dock" refers to a position where some first coarse alignment means is approximately in position to be engaged. At this stage and depending upon design details, the distal end of the guide pins are ready to enter their respective guide receptacles. Still further maneuvering will bring the test head to a "ready to actuate position," which was defined previously in terms of FIGS. 1A through 1D. More generally, "ready to actuate" refers to a position where a test head has achieved a position where a docking apparatus may be actuated. At the ready to actuate position, approximate planarization and alignment in X, Y and Theta Z have been achieved. As the dock is actuated and the guide pins 112 become more fully inserted into their respective guide-pin holes 112a, alignment and planarization become more precise. It is noted that in manipulator driven docking, as described in the '258 and '737 patents, sensors detect the equivalent of a ready to actuate position in order to change from a coarse positioning mode to a fine positioning mode. Thus, to one of ordinary skill in the art, sensing a ready to actuate position in an actuator driven dock would be a natural extension (intuitive and obvious) of what is taught and disclosed by the '258 and '737 patents.

Docks of the type described above have been used successfully with test heads weighing up to and over one thousand pounds. However, as test heads have become even larger and as the number of contacts has increased, a number of problems have become apparent. First, the force required to engage the contacts increases as the number of contacts increases. Typically a few ounces per contact is required; thus docking a test head having 1000 or more contacts requires in excess of 100 or 200 pounds for this purpose. With test heads occupying a volume of approximately a cubic meter or more, it becomes increasingly difficult for the operators to observe all of the gussets and cams to determine when the test head is in a ready to dock and the ready to actuate positions. Also due to the resiliency of the compliance mechanisms and cable in the test head manipulator, the bounce back effect has made it difficult to maintain the test head in the ready to actuate position while simultaneously initiating the actuation. A further difficulty that arises from the increased amount of force to be overcome by the actuation mechanism is that the cam motion can become unsynchronized due to the stretching of the cable. A similar problem of mechanism distortion is known in docks using solid links and bell cranks.

Docking apparatus such as described above may be characterized by the number of guide pins and receptacles used. The apparatus described in the '815 patent is characterized as a two-point dock, and the apparatus shown in FIGS. 1A through 1D is known as a four point dock. Three point docks following the same general principles are also known and in common use. The present invention will be described in terms of a four-point configuration, however, this does not limit its application to other configurations.

SUMMARY OF THE INVENTION

In an exemplary embodiment the present invention provides a system and method for docking an electronic test head with a handling apparatus. An assembly is provided for at least partially aligning and subsequently bringing together the electronic test head and the handling apparatus. A power driven actuator provides powered bringing together of the electronic test head and the handling apparatus.

In another exemplary embodiment, the present invention again provides a system and method for docking an electronic test head with a handling apparatus. An assembly is provided for bringing together the electronic test head and the handling apparatus. A mechanism for operating the assembly, and at least one actuator for operating the mechanism, are also provided.

In another exemplary embodiment, the present invention again provides a system and method for docking an electronic test head with a handling apparatus. An assembly is provided for bringing together the electronic test head and the handling apparatus. A plurality of cams are situated on either the test head or the handling apparatus. The cams are for operating the assembly. A plurality of gussets are situated on the other of the test head and the handling apparatus. Each of the gussets is for aligning adjacent to at least one of the plurality of cams. At least one power driven actuator provides powered operation of the cams.

In another exemplary embodiment, the invention provides a system for docking an electronic test head with a handling apparatus, comprising an assembly for bringing together said electronic test head with said handling apparatus. A mechanism for operating said assembly is provided. The mechanism includes at least two cams situated on one of said test head and said handling apparatus for operating said assembly. At least one actuator for operating said mechanism is provided. A linkage assembly extends between the at least one actuator and the at least two cams, the linkage assembly including at least one linkage bar associated with the actuator and including at least one elongated slot which receives a pivot pin pivotally engaging a second linkage member of the linkage assembly.

In yet another exemplary embodiment, the present invention again provides a system and method for docking an electronic test head with a handling apparatus. A plurality of cams are situated on either the test head or the handling apparatus. At least one actuator powers the cams. Gussets are provided on the other of the test head and the handling apparatus for mating with the cams in order to dock the test head with the handling apparatus. Cam followers are attached to the gussets for engaging the cams.

In yet another exemplary embodiment, the present invention again provides a system and method for docking an electronic test head with a handling apparatus. An assembly is provided for bringing together the electronic test head and the handling apparatus. At least two cams, situated on one of the test head and the handling apparatus, operate the assembly. A plurality of gussets are situated on the other of the test head and the handling apparatus. Each of the gussets are for aligning adjacent to at least one of the plurality of cams. At least one power driven actuator provides powered operation of the cams. A plurality of alignment features are situated on one of the test head and the handling apparatus. A plurality of alignment feature receptacles are situated on the other of the test head and the handling apparatus for receiving the alignment features.

BRIEF DESCRIPTION OF THE DRAWINGS

FIG. 4B is a perspective view of the handling apparatus side of a docking apparatus.

DETAILED DESCRIPTION OF THE INVENTION

The present invention is directed to improving the basic manual dock as described above. In particular, it is directed towards simplifying the docking of large, heavy test heads having hundreds or thousands of electrical contacts requiring actuation forces of hundreds or thousands of pounds. The present invention also provides the means to fully automate the process of docking between the ready to actuate and fully docked positions.

Figure 1A:
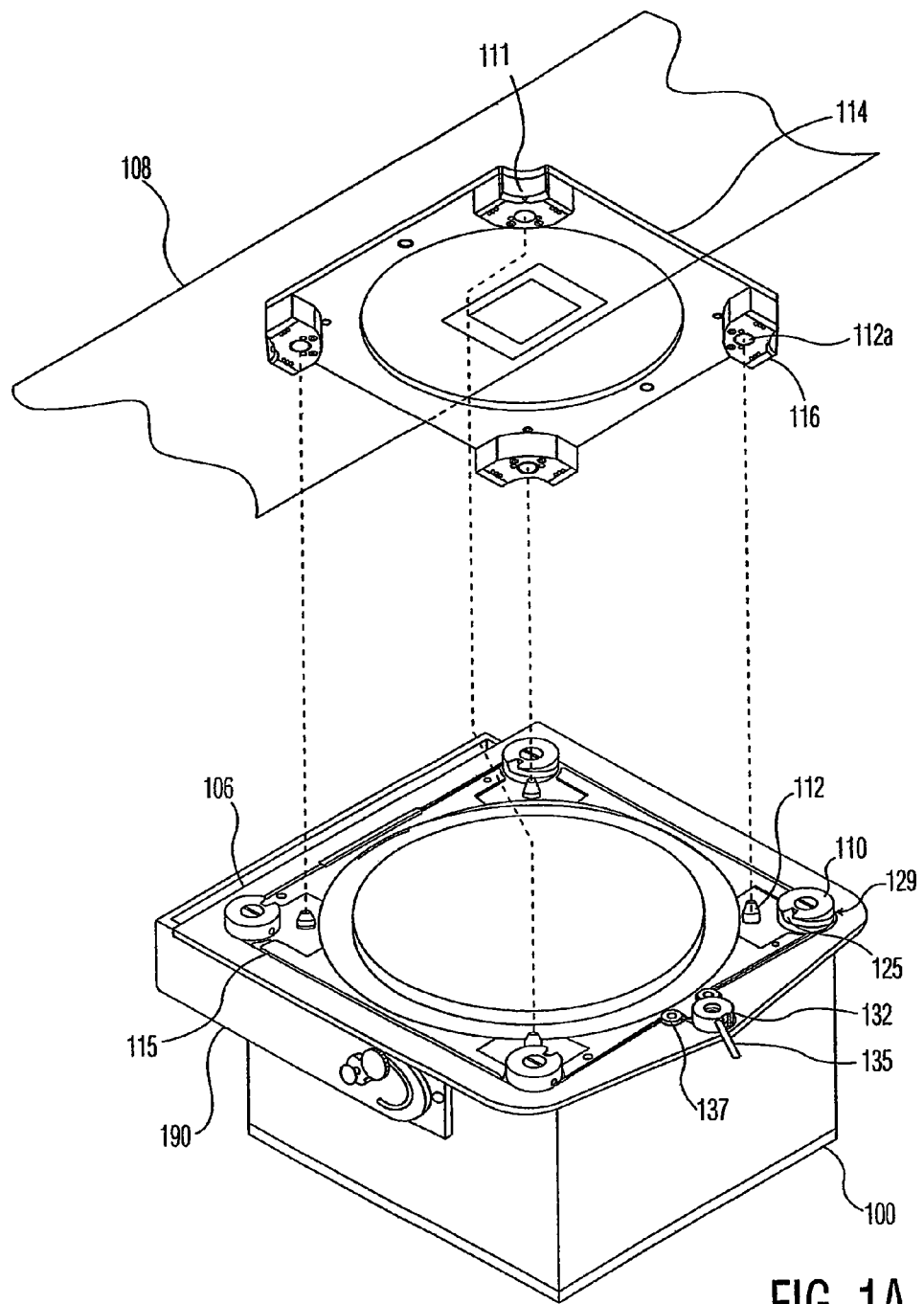
FIG. 1A is a perspective view of a prior art docking apparatus.
Figure 1B:
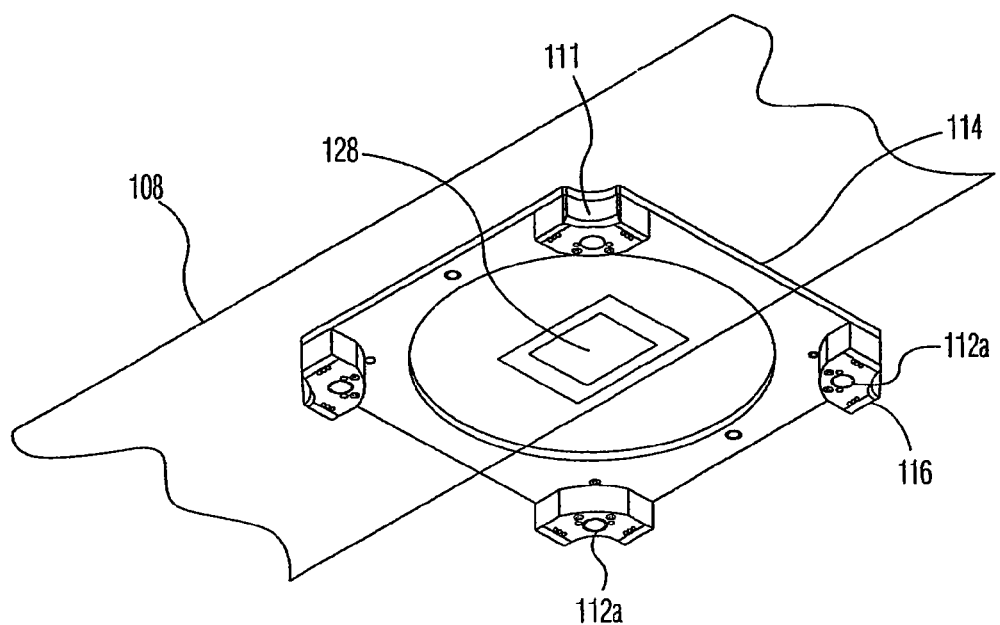
FIG. 1B is a perspective view of the portion of a prior art docking apparatus that is attached to a handling apparatus.
Figure 1C:
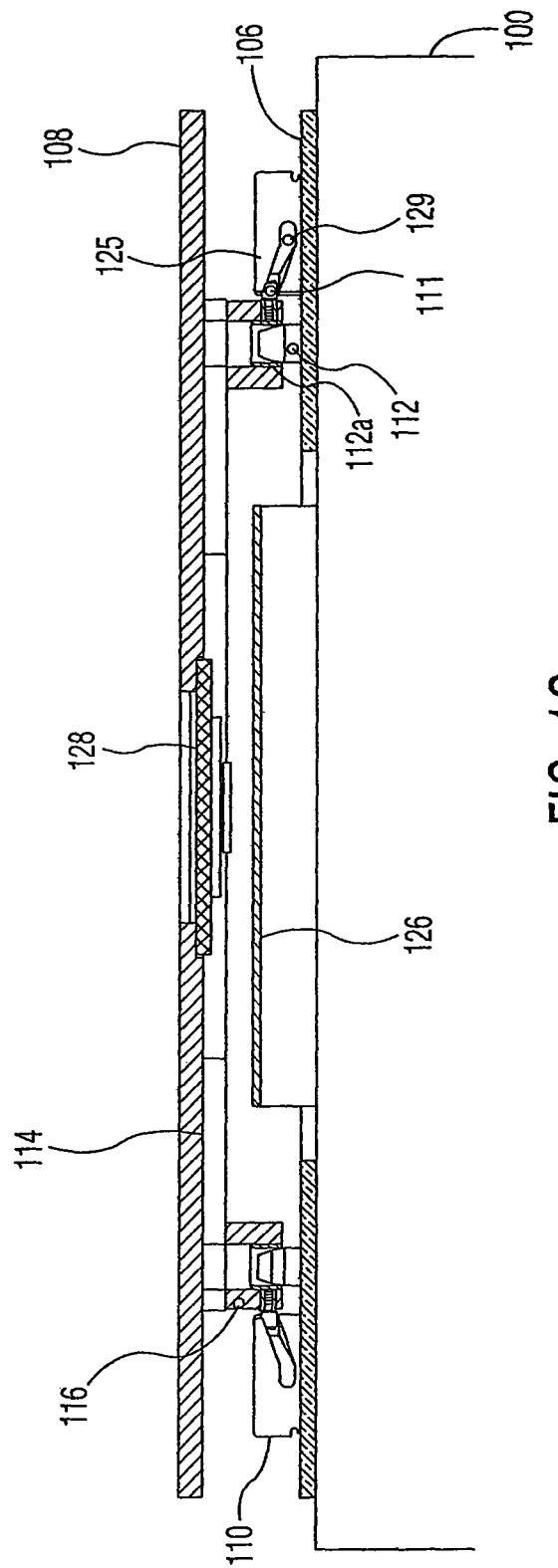
FIG. 1C is a sectional view of the prior art docking apparatus in the ready to actuate position.
Figure 1D:
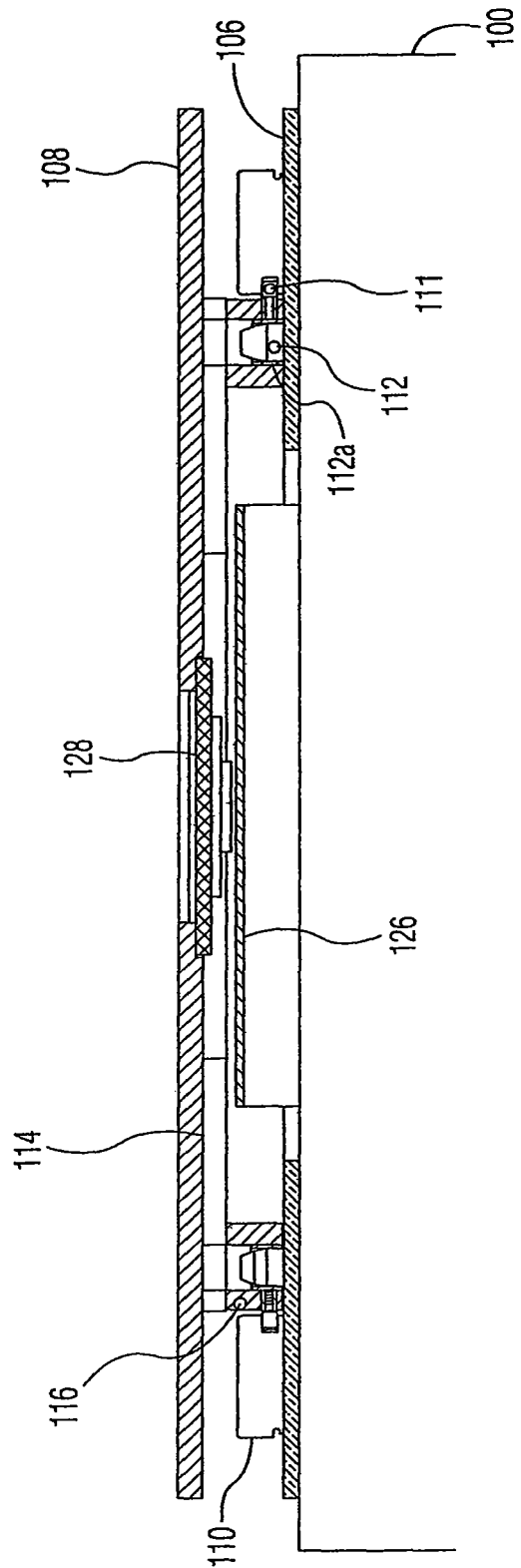
FIG. 1D is a sectional view of the prior art docking apparatus in the fully docked position.
Figure 2:
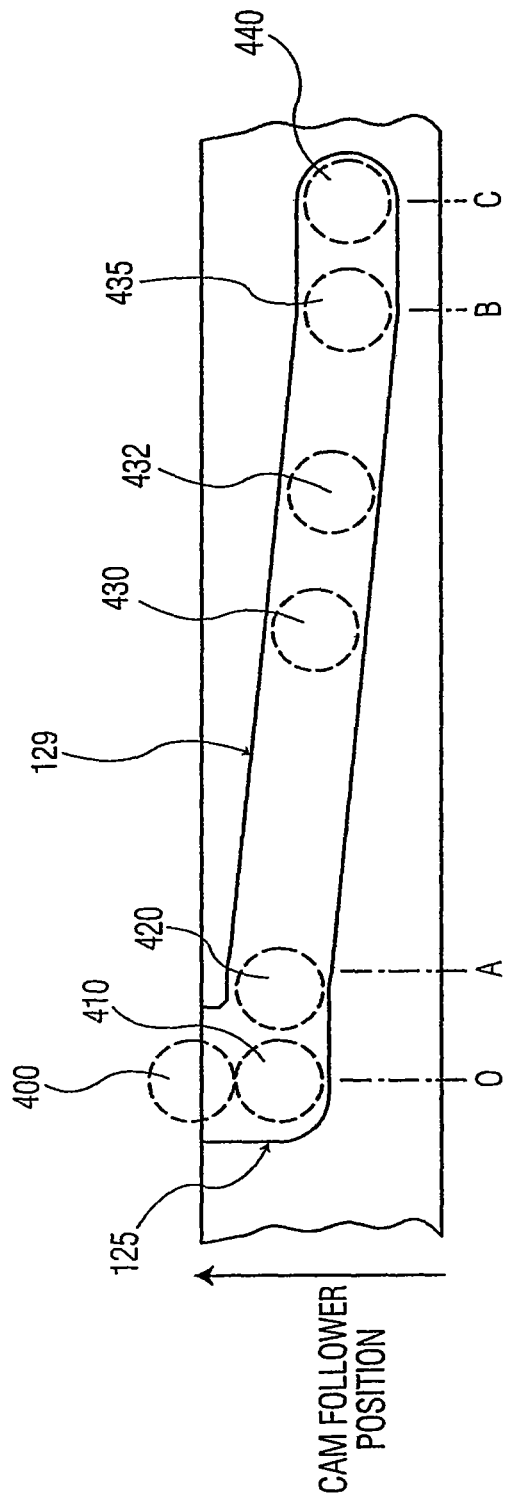
FIG. 2 is a not-to-scale diagram illustrating the vertical position of a cam follower vs. the angle of rotation of its cam of a prior art docking apparatus.
Figure 3:
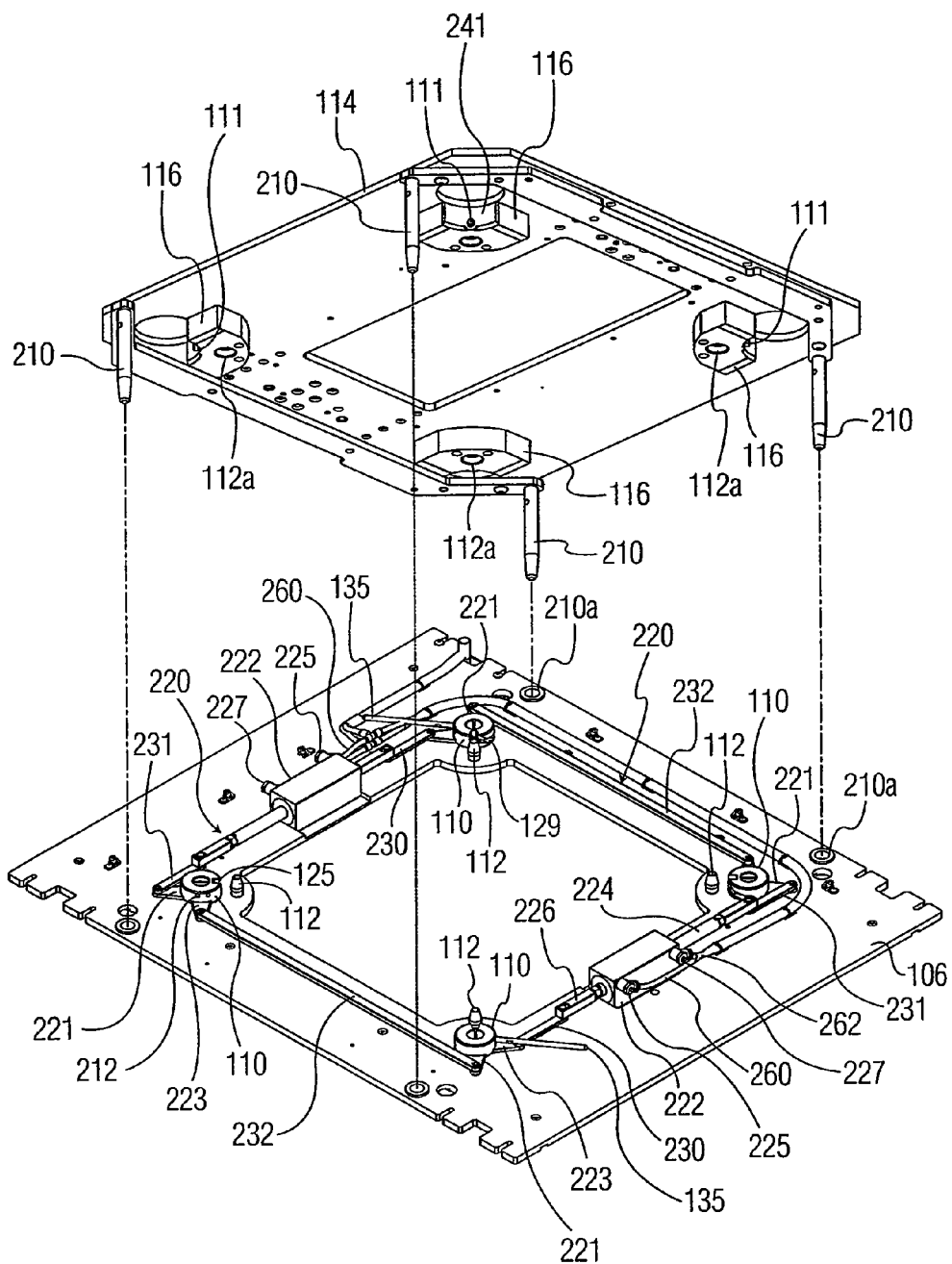
FIG. 3 is a perspective view of a docking apparatus according to the present invention.
Figure 4A:
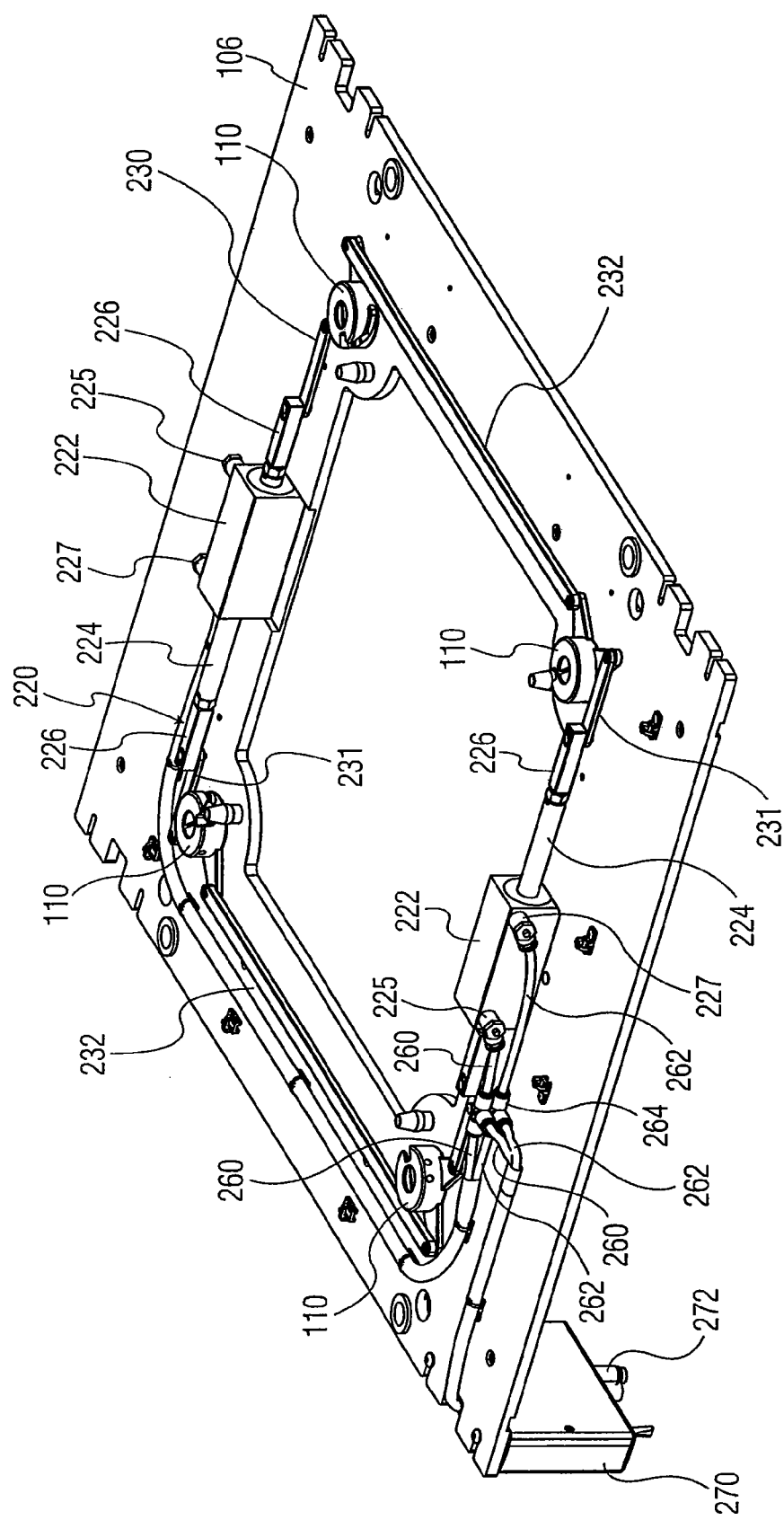
FIG. 4A is a perspective view of the test head side of a docking apparatus.

FIG. 3 is a perspective drawing of an improved dock in accordance with an exemplary embodiment of the present invention. FIG. 4A provides an enlarged view of the test head side of the docking apparatus illustrated in FIG. 3, and FIG. 4B provides an enlarged view of the handling apparatus side of the docking apparatus illustrated in FIG. 3. As in FIG. 1A, the docking apparatus in FIG. 3 includes gusset plate 114, which attaches to the handler apparatus, and face plate 106, which attaches to the test head. Four gussets 116 each having a guide pin receptacle 112a and a cam follower 111 are attached to gusset plate 114. For example, each gusset may be attached to gusset plate 114 using mounting screws 199. Correspondingly, four cams 110 and four guide pins 112 are arranged on faceplate 106. Accordingly, the docking apparatus shown in FIG. 3 is a four-point dock; however, the concepts to be described apply just as well to two-point, three-point or other configurations. Furthermore, the concepts to be described will also apply to docks having other arrangements of cams, including linear cams.

Both the face plate 106 and gusset plate 114 have central openings to accommodate the electrical interfaces (not shown) of the test head and handler apparatus respectively, as previously described with respect to FIGS. 1A through 1D. The guide pins 112 are disposed at the four corners of an approximate square whose center is located at the approximate center of the test head electrical interface. The locations of the cams 110, gussets 116, and guide pin holes 112a, are determined by the locations of the guide pins 112. In particular, each cam 110 is approximately centered on a line extending from the center of the aforementioned square through the guide pin 112 and positioned further from the square's center than is the guide pin 112. As was described with respect to FIG. 1A, the gussets 116 are shaped with a circular cut out 241 that is approximately concentric with the cam 110 when the test head is fully docked, and a cam follower 111 is attached to the surface of each circular cut out 241 of each gusset 116. As is shown in FIG. 3, the gusset plate 114 has circular cutouts conforming to the gusset cutouts 241. Also, as described with respect to FIG. 1A, each cam 110 in FIG. 3 has a side helical groove 129 around its circumference with an upper cutout 125 on the upper face. Each gusset 116 has a guide pin hole or receptacle 112a bored in it.

Also in FIG. 3, each guide pin hole 112a corresponds to a respective guide pin 112. These are arranged so that when the test head is fully docked, each guide pin 112 will be fully inserted into its respective guide pin hole 112a. The fit of each guide pin 112 in its corresponding hole 112a is a close fit. Thus, the guide pins 112 and guide pin holes 112a provide alignment between the test head 100 and the handler apparatus 108.

Continuing with FIG. 3, each cam 110 has one or more threaded holes 212 in its side. One or more docking handles 135 are made from suitable rod and threaded on one end so that each may be attached to a cam 110 by screwing it into an appropriate hole 212. While handles 135 are illustrated herein, such are generally provided as a backup means of rotation of the cams 110, e.g. in the event the actuator assembly as described herein is not functional due to a loss of the fluid source.

Four coarse alignment pins 210 are attached near the four corners of gusset plate 114. Four coarse alignment guide holes lined with bushings 210a are disposed at corresponding locations on face plate 106. The coarse alignment pins 210 fit very loosely into the corresponding coarse alignment bushings 210a. The coarse alignment pins 210 are longer than the height of the cams 110. Consequently, the insertion of the coarse alignment pins 210 into their corresponding bushings 210a provides a first coarse pre-alignment of the test head with the handler apparatus. It is to be noted that a docking apparatus need not have this feature in order to benefit from other aspects of the present invention. It is also to be noted that both guide pins 112 and the coarse alignment pins 210 perform alignment functions and, in general, both may be termed "alignment pins." The term "alignment pin" is used herein to refer to alignment features such as guide pins and course alignment pins.

As described in U.S. Pat. No. 7,109,733, incorporated herein in its entirety, sensors (not shown) may be incorporated in the docking apparatus of the present invention. The outputs of the sensors may be connected to appropriate inputs of a system controller (not shown), which may also control other functions of the positioning system, including, for example, the control of selected manipulator motion axes.

Another problem overcome by the present invention is the increasing docking force required for larger test heads. As the test head is docked, electrical connectors are engaged and resilient contacts such as pogo pins are compressed. For situations requiring the connection of several hundreds or thousands of electrical contacts, the direct force required can be up to one-thousand (1000) or two-thousand (2000) pounds. The dock actuator, whether manual or powered, must overcome this force as well as the force necessary to move the test head and overcome any compliance mechanisms. The actual force that must be applied by the actuator is the foregoing direct force divided by the mechanical advantage of the actuation mechanism. In docks having circular cams for example, the mechanical advantage is determined in part by the slope of the cam groove 129. It is possible to provide a cam groove 129 with a non-constant slope so that mechanical advantage changes as a function of cam position. This may allow for a dock which requires an approximately constant actuator force over the range of motion in situations where the direct force to be overcome varies with the separation between electrical interfaces. As test heads grow larger and heavier with an increasing number of contacts, it becomes more and more of a problem to provide a manually operated actuator.

Referring to FIGS. 3, 4A, 5A, 5B and 6, an actuator assembly 220 is provided to facilitate rotation of the cams 110. The actuator assembly 220 generally comprises at least one linear actuator 222 and a series of link bars 230, 231 and 232. The present embodiment is illustrated with two linear actuators 222, but either one or more than two linear actuators 222 may alternatively be provided. As described with respect to the exemplary embodiment illustrated herein, the actuators 222 are double acting pneumatic cylinders. However, any fluid-based cylinders, including hydraulic cylinders, may be adapted to practice the invention. Further, the invention is not limited to double acting cylinders. For example, other types of linear actuators may also be adapted to the application, such as, but not limited to, electrical motor powered actuators or electrical and/or electo-magnetic solenoids. Alternatively, a rotating motor and appropriate gearing may be added to impart powered rotation to one of the circular cams or cable driver (if so equipped) in a dock having circular cams or to a bell crank in a dock which incorporates linear cams and linkage. The rotating motor could be, for example, electrical, hydraulic or pneumatic.

Figure 5A:
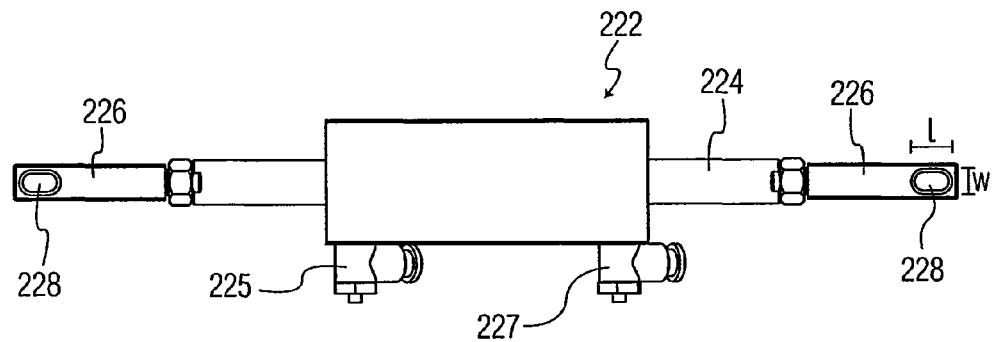
FIG. 5A is a top plan view of an exemplary actuator according to an embodiment of the present invention.
Figure 5B:
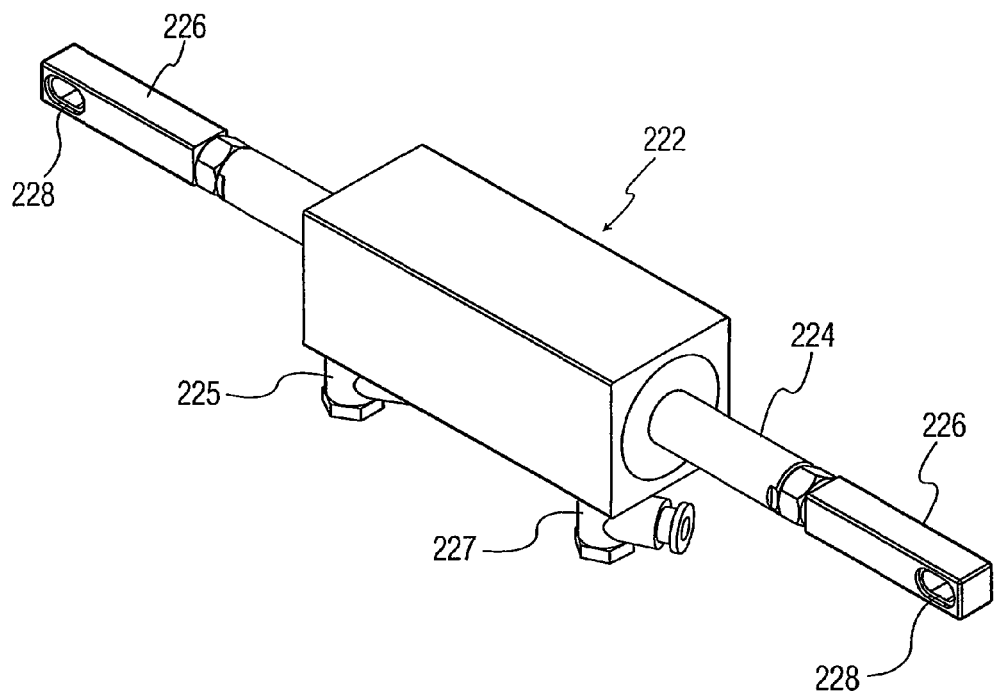
FIG. 5B is a perspective view of the actuator of FIG. 5A illustrated rotated 90° relative to its normal position on the face plate.

Referring to FIGS. 5A and 5B, the exemplary linear actuator 222 is a pneumatic cylinder with a rod 224 extending therethrough and a pair of inlet ports 225 and 227. Supplying fluid through port 225 causes rod 224 to move to the right in FIG. 5A and supplying fluid through the port 227 causes rod 224 to move to the left in FIG. 5A. As described above, actuator 222 does not have to be of this double acting nature and can instead be replaced by opposed single acting cylinders, for example, a single-acting cylinder on each side of the face plate 106. A linkage bar 226 is attached to each end of the rod 224. Each linkage bar 226 includes an elongated slot 228 having a length l greater than its width w.

Figure 6:
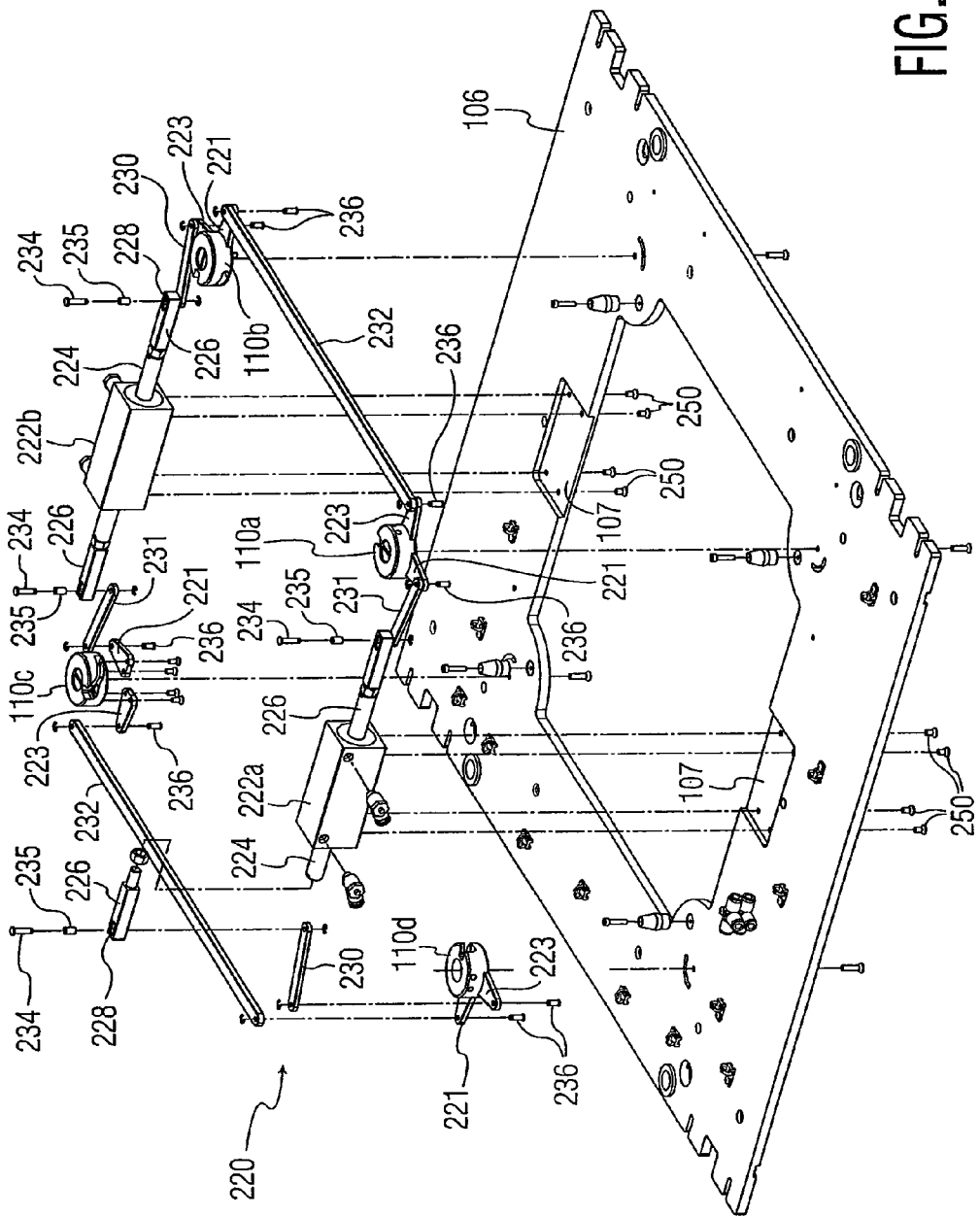
FIG. 6 is an exploded perspective view of the handling apparatus side of a docking apparatus.

Referring to FIG. 6, each slot 228 is configured to receive a pivot pin 234 with a bushing 235 positioned thereabout. The bushing 235 is positioned in the slot 228 and the pivot pin 234 extends through the bushing 235 and through a pivot hole in one end of a corresponding short linkage 230, 231. The bushing 235 has a diameter approximately equal to the width w of the slot 228 such that the bushing 235 may move axially within the slot 228. As such, the linkage bar 226 and the respective short linkage 230, 231 are pivotal relative to one anther about pivot pin 234 while the pivot point is axially adjustable, as will be described in more detail below. While a slot is described herein to facilitate pivoting and axial adjustment, other mechanisms may be utilized such that each of the linking members is moved via a pulling tension as described herein. For example, a short link (not shown) may be pivotally connected at each end between the linkage bar 226 and short linkage 230, 231.

In the present embodiment, the actuator assembly 220 further includes, moving clockwise from linear actuator 222a in FIG. 6 (as viewed from the bottom of the figure), a linkage bar 226 extending from the rod 224 and pivotally attached to short linkage 231. The opposite end of short linkage 231 is pivotally connected to a first flange 221 of cam 110a via a pivot pin 236. First flange 221 is fixed to cam 110a such that movement of first flange 221 via actuation of the actuator 222 causes cam 110a to rotate. As cam 110a rotates, second flange 223 which is attached to cam 110a is caused to rotate therewith. While first and second flanges 221 and 223 are illustrated herein, such may be replaced by a single flange having elongated slots (not shown). A long linkage 232 is pivotally connected at each end between the second flange 223 and the first flange 221 of the next cam 110b. A short linkage 230 is pivotally connected between the second flange 223 of this second cam 110b and the linkage bar 226 extending from end of the rod 224 of actuator 222b. A similar linkage pattern continues from actuator 222b through the pair of cams 110c and 110d and to the linkage bar 226 connected to the opposite end of the rod 224 of the actuator 222a. While it is preferred that the system is symmetrical in this regard, such is not required.

In the present embodiment, each actuator 222 is attached to face plate 106 by means of screws 250 or the like. Recesses 107 configured to receive a portion of each actuator 222 may be provided in the face plate 106 to reduce the height of the actuator 222 extending above the surface of the face plate 106. As illustrated, each actuator is fixed to the face plate 106 and does not pivot or otherwise move relative to the face plate 106 during operation. With the actuators 222 fixed, the slots 228 in the linkage bars 226 allow the pivot points to move axially to accommodate the change in distance and orientation between the fixed actuator 222 and the pivoting flange 221, 223, as will be described in more detail hereinafter.

Because the cylinders may be either pneumatic (i.e. operated by a compressible gas such as air) or hydraulic (i.e., operated by an incompressible liquid), the following description will assume either case and incorporate the word "fluid" to mean either a liquid or a gas.

Referring to FIGS. 3 and 4A, fluid used by actuators 222 may be delivered by a pair of hoses 260 and 262 extending from a controller 270. The controller 270 has an inlet 272 that receives pressurized fluid from a fluid source (not shown). The controller 270 preferably includes a regulator such that fluid of a desired pressure may be provided through hose 260 or 262. The controller 270 has a switch (not shown), for example, a three-way toggle switch, which allows an operator to direct fluid through hose 260, which is directed to inlets 225, direct fluid through hose 262, which is directed to inlets 227, or not provide fluid through either hose 260, 262. The present embodiment includes a fluid splitter 264 such that fluid from controller 270 is provided to both actuators 222 simultaneously. Alternatively, a separate controller could be provided for each actuator 222.

It is observed that when in the docked position, a loss of power or fluid supply will not cause the cams to rotate and the dock to become undocked since the fluid is trapped in the respective hose 260, 262 and the controller 270. This provides a safety lock even if the cam followers 111 does not fully seat within the respective helical grooves 129. In the case of fluid pressure loss to the controller 270, the dock may be operated by hand by releasing the trapped fluid, for example, through a valve or cutting of the respective hose.

Having described the components of an exemplary embodiment of the docking apparatus of the present invention, its operation will be described with reference to FIGS. 7A-12B.

Figure 7A:
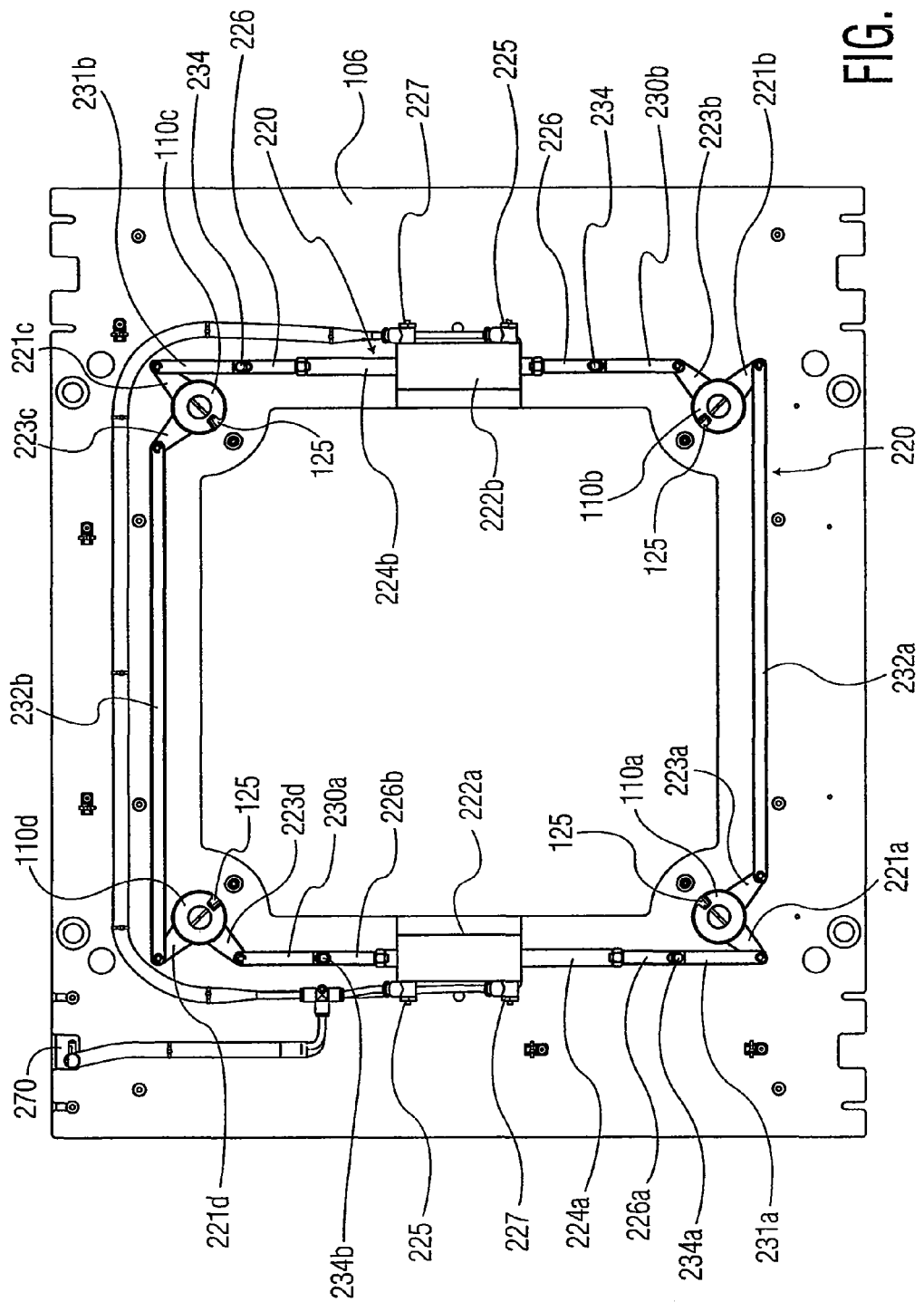
FIG. 7A is a top plan view of the handling apparatus side of a docking apparatus in an undocked position at the start of a docking operation.
Figure 7B:
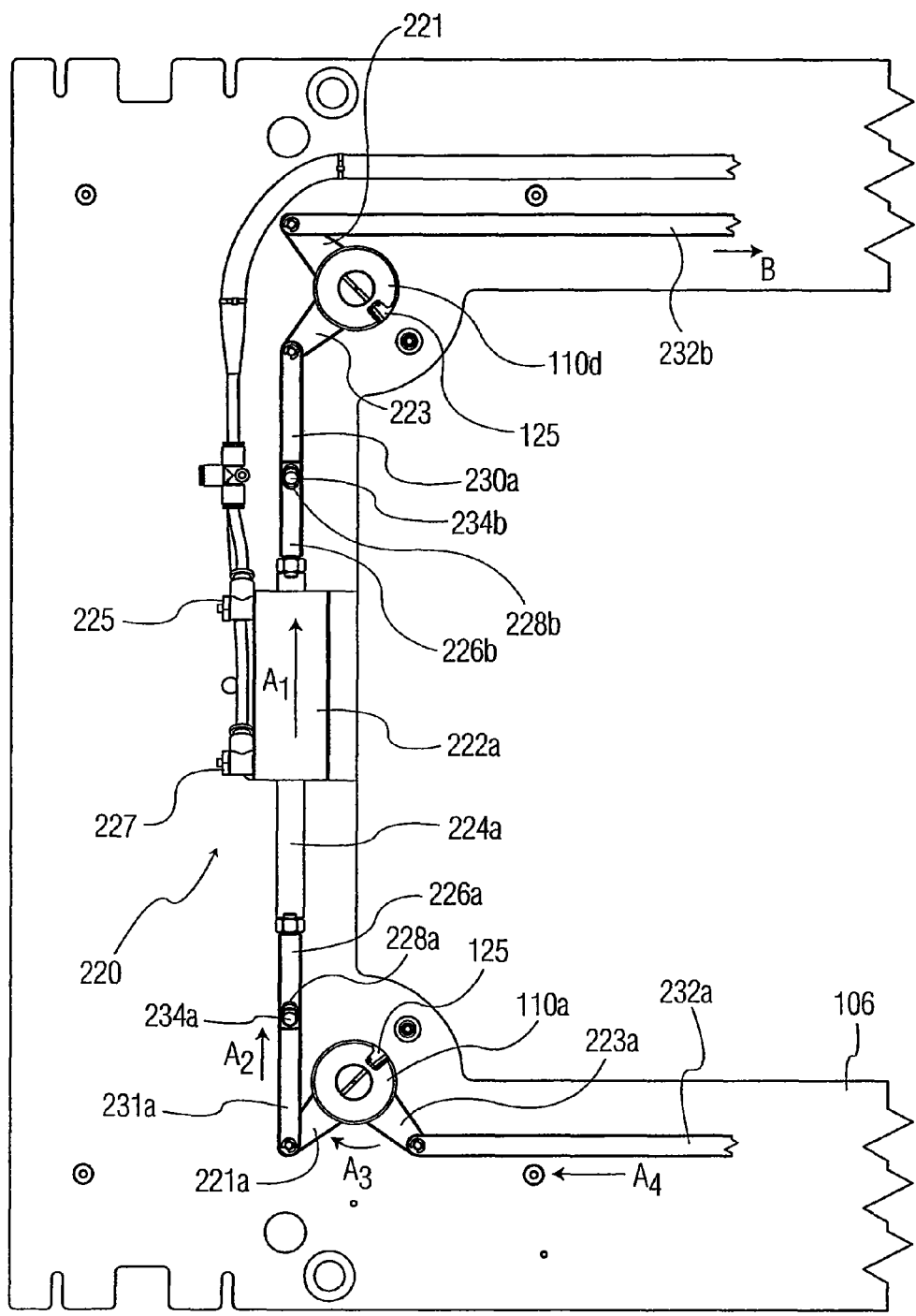
FIG. 7B is an expanded top view of one side of the handling apparatus side of the docking apparatus as shown in FIG. 7A.

FIGS. 7A and 7B show the actuator assembly 220 in an undocked position at the start of a docking operation. To perform a docking operation, the cams 110 must be rotated in the clockwise direction in the figures. To initiate such, an operator initiates the controller 270 to provide pressurized fluid to inlet valve 227, thereby causing the rod 224 to move in the direction of arrow $A_1$. As the rod 224 moves, the linkage bar 226a moves with it, and the pivot pin 234 contacts the end of the slot 228 such that the axial motion of the linkage bar 226a is translated to the short linkage 231a as indicated by arrow $A_2$. Movement of short linkage 231a in turn causes the first and second flanges 221a, 223a to rotate with the cam 110a as indicated by arrow $A_3$. Rotation of the second flange 223a causes the long linkage 232a to move as indicated by arrow $A_4$ thereby causing the cam 110b at its opposite end to begin to rotate. The long linkage 232a does not needs slots as both ends are connected to respective flanges 223a, 221b which generally move along the same path.

It is noted in FIG. 7B that as rod 224a moves in the direction of arrow $A_1$, it could push gently on the short linkage 230a as slack in the system is taken up, in particular, as the initial axial motion of pivot pin 234b is taken up in the slot 228b of linkage bar 226b. The short linkage 230a and the long linkage 232b are instead pulled by the motion of rod 224b of linear actuator 222b, as indicated by arrow B, in a manner similar to that described above with respect to actuator 222a. This avoids buckling or the like which may be encountered if any of the linkages are pushed, and thus placed in compression, rather than pulled in tension as in the present invention. Even if only a single actuator 222 is utilized, e.g. actuator 222b is replaced with a long linkage, the long linkage 232b and short linkage 230 would still be pulled, and thus in tension, by the continuous force exerted by actuator 222 on linkage bar 226a through each of the remaining linkages and flanges. Because the linkages are always in tension during operation, they are not subject to compression forces that would undesirably cause them to buckle. Thus, the linkages may be made of relatively thin or compressible material provided it has sufficient strength in tension. Indeed, it is possible that the links could in principle be made of wire rope or cable.

Figure 8A:
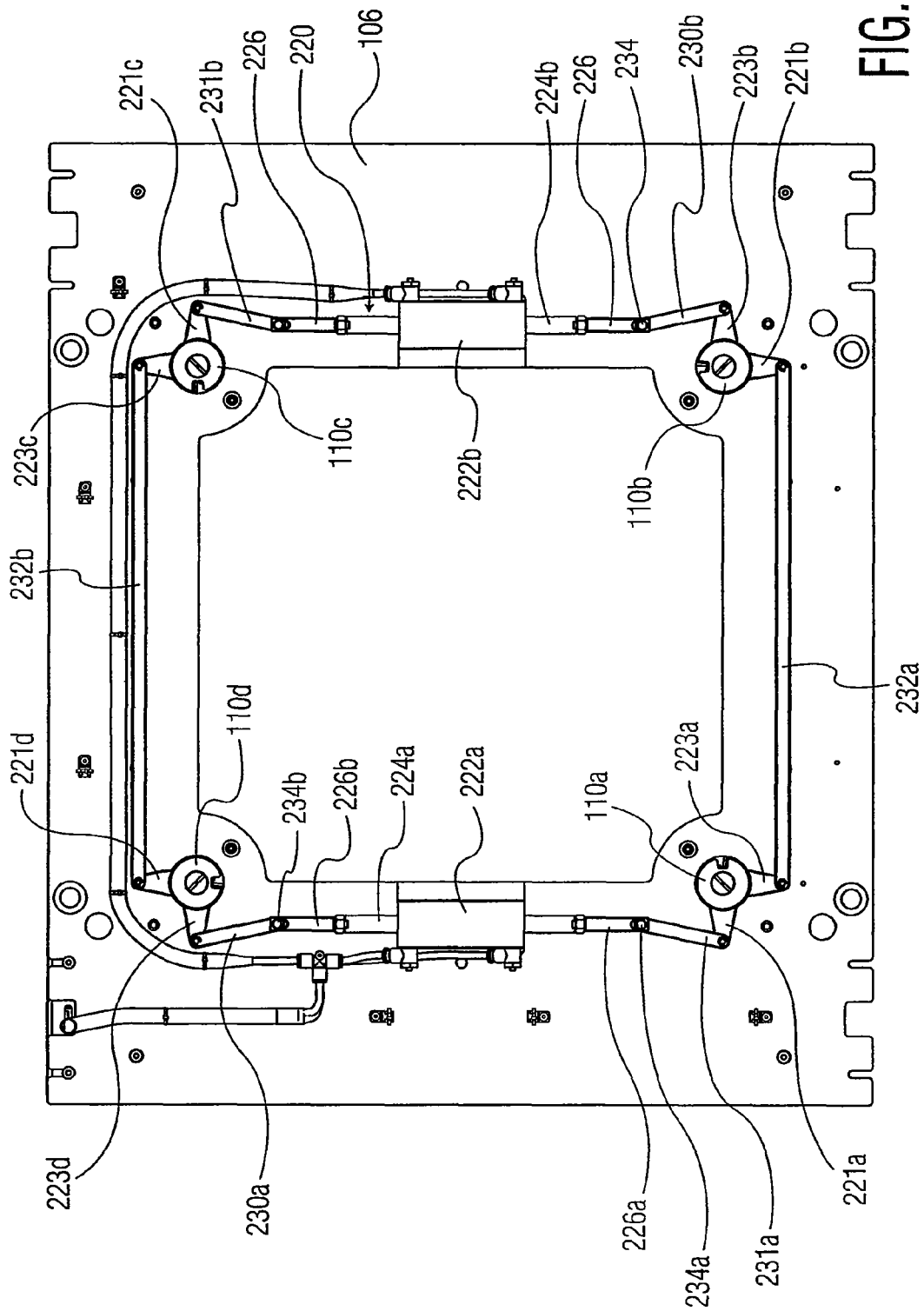
FIG. 8A is a top plan view of the handling apparatus side of a docking apparatus at mid travel from the undocked position to the docked position.
Figure 8B:
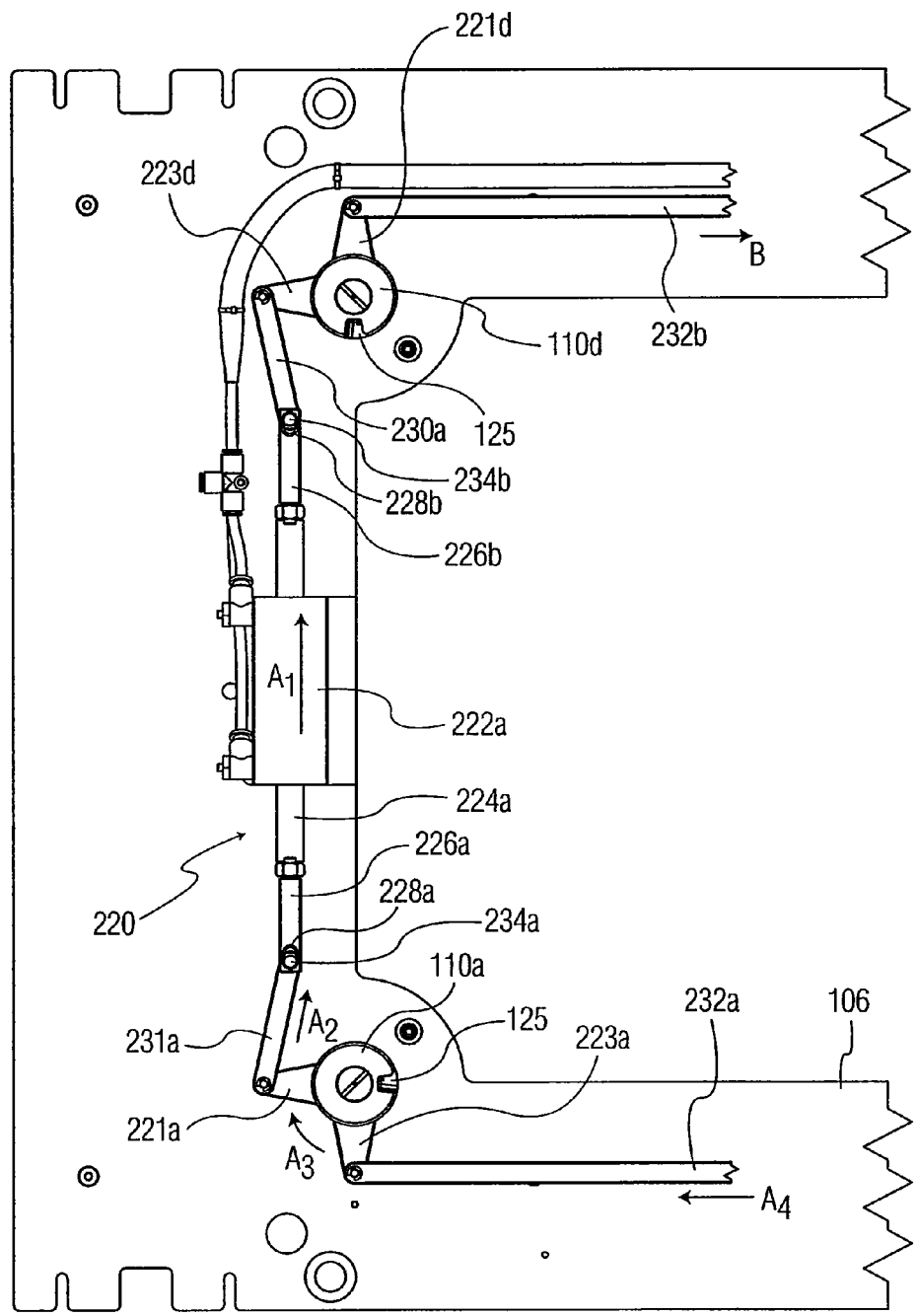
FIG. 8B is an expanded top view of one side of the handling apparatus side of the docking apparatus as shown in FIG. 8A.

Referring to FIGS. 8A and 8B, the actuator assembly 220 is shown at mid travel from the undocked position to the docked position. The rod 224a continues to travel as indicated by arrow $A_1$ and each of the resulting forces remains. Simultaneously, the rod 224b also continues to travel in a similar manner. As illustrated herein, the short linkage 230a has now been moved by rotation of the cam 110d and second flange 223d which in turn were moved by the pulling force, indicated by arrow B, on long linkage 232b. Rotation of the second flange 223d causes the short linkage 230a to both move axially and pivot. The pivot pin 234b is free to move axially along the length of the slot 228b, thereby taking up the change in distance between the linkage bar 226b and the pivot point of the second flange 223d. On the opposite end of the rod 224a, the pivot pin 234a can not move any further in the slot 228a, and as a result, the linkage bar 226a pulls the short linkage 231a and first flange 221a, with the pivot angle taking up the change in relative positions.

Figure 9A:
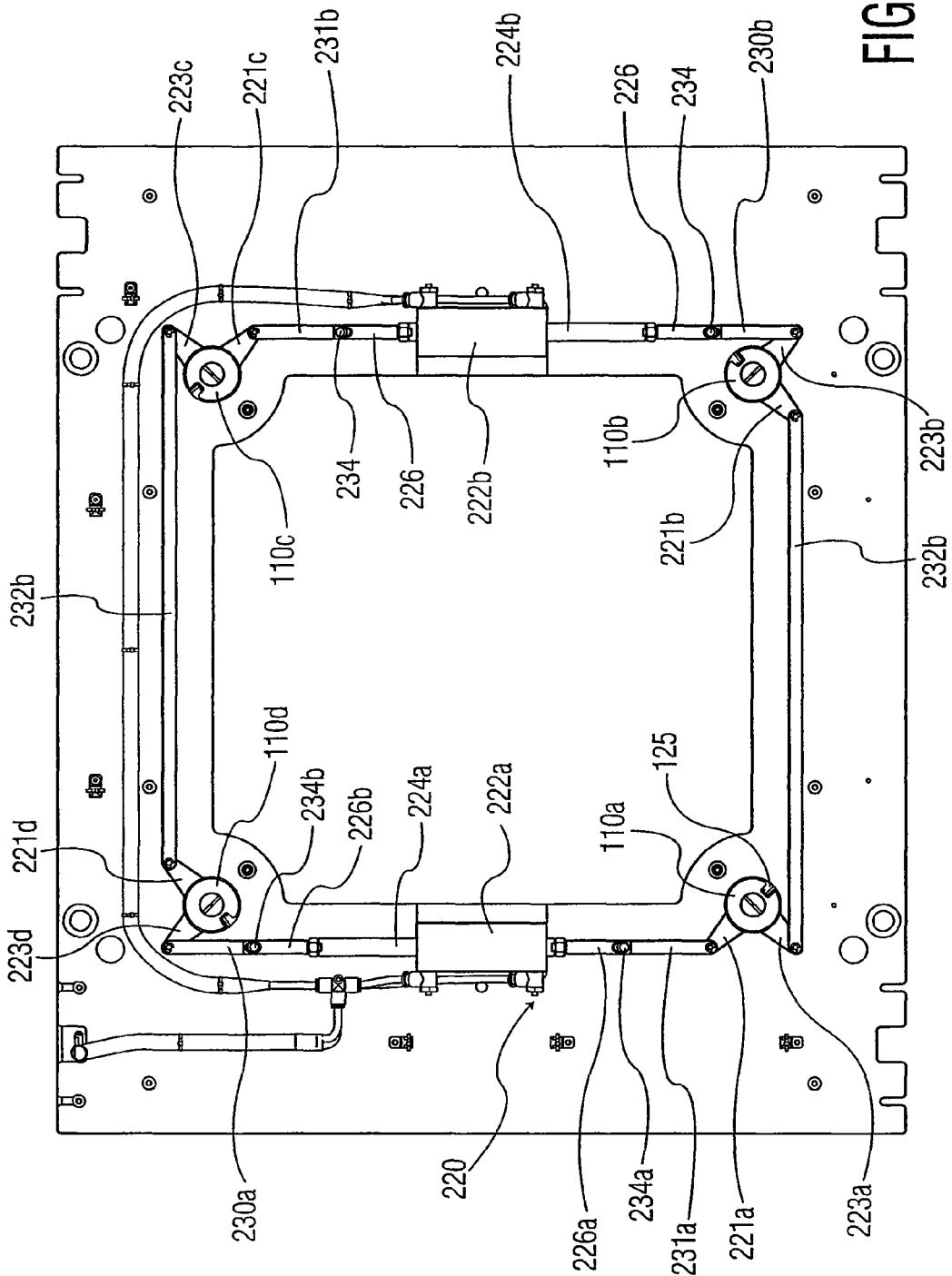
FIG. 9A is a top plan view of the handling apparatus side of a docking apparatus after it has just arrived at the docked position.
Figure 9B:
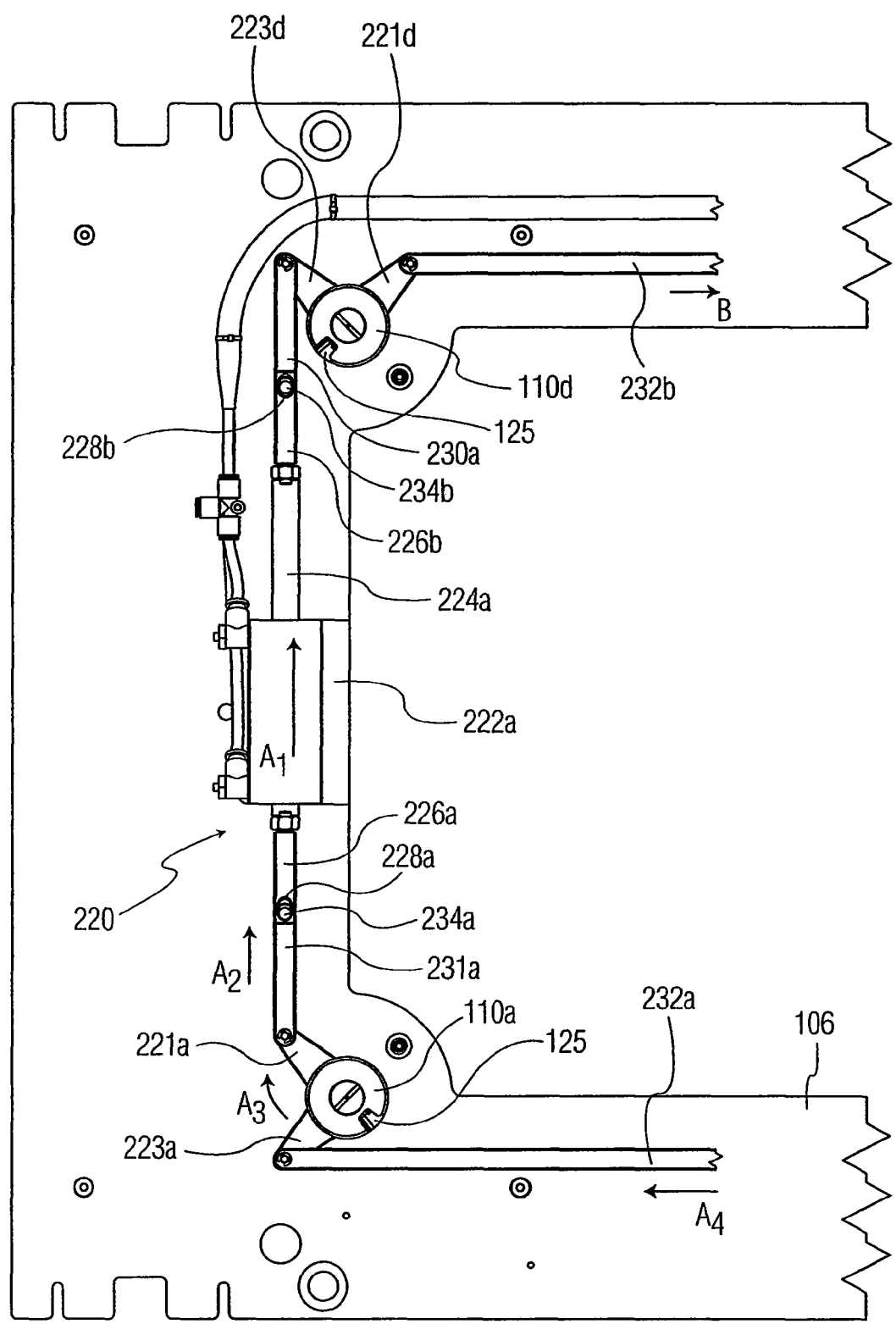
FIG. 9B is an expanded top view of one side of the handling apparatus side of the docking apparatus as shown in FIG. 9A.

Referring to FIGS. 9A and 9B, the actuator assembly 220 is shown after it has just arrived at the docked position. The rod 224a continues to travel as indicated by arrow $A_1$ and each of the resulting forces remains. Simultaneously, the rod 224b also continues to travel in a similar manner. As illustrated herein, the short linkage 230a has now been moved by rotation of the cam 110d and second flange 223d which in turn were moved by the pulling force, indicated by arrow B, on long linkage 232b. Rotation of the second flange 223d again causes the short linkage 230a to both move axially and pivot. The pivot pin 234b is free to move axially along the length of the slot 228b such that as the distance between the linkage bar 226b and the pivot point of the second flange 223d changes once again, the pivot pin 234b moves axially along the slot 228b, for example, to the approximate midpoint. On the opposite end of the rod 224a, the pivot pin 234a still can not move any further in the slot 228a, and as a result, the linkage bar 226a pulls the short linkage 231a and first flange 221a until the cam 110a is in the docked position.

Figure 10A:
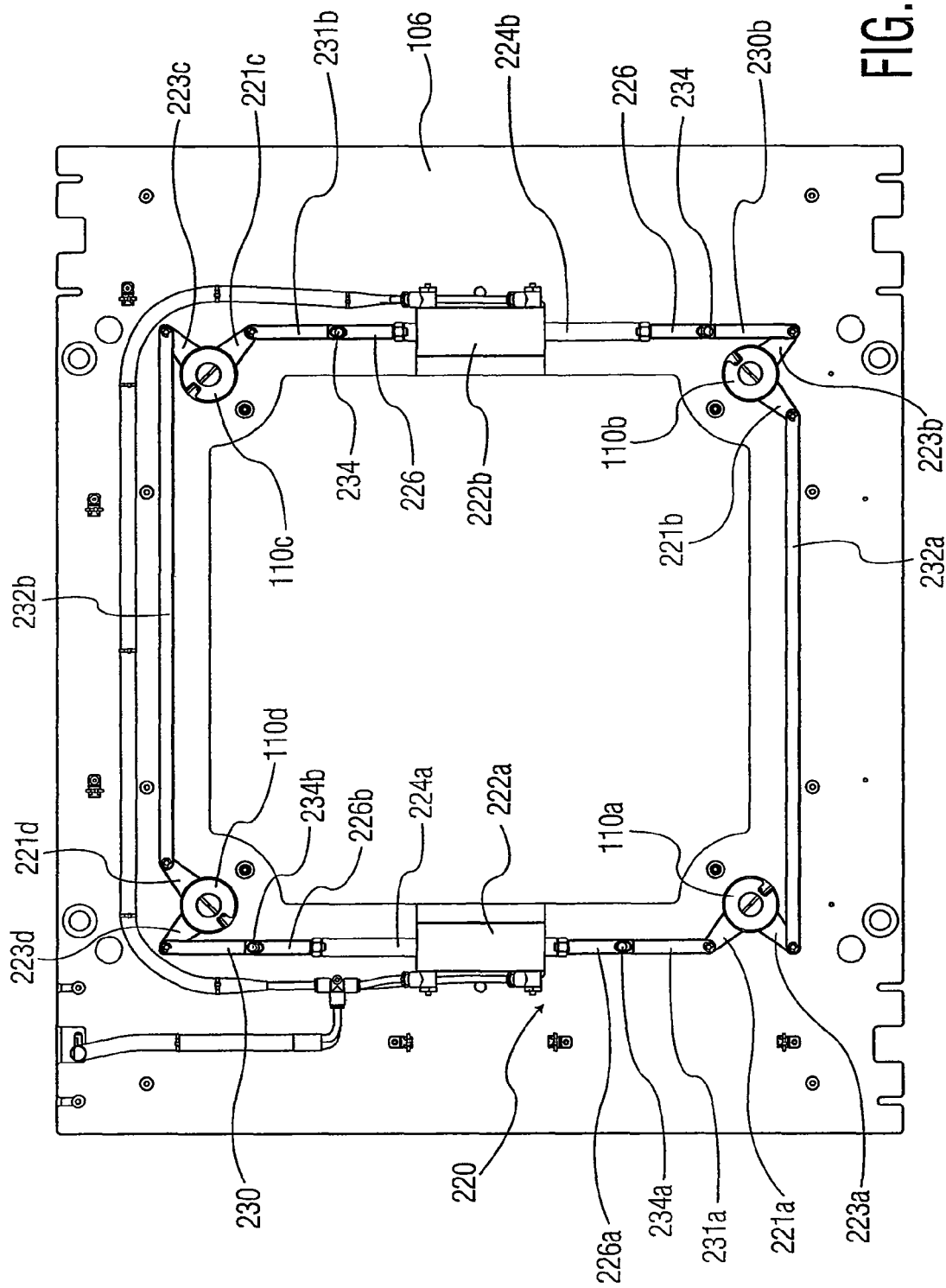
FIG. 10A is a top plan view of the handling apparatus side of a docking apparatus at the start of an undocking operation.
Figure 10B:
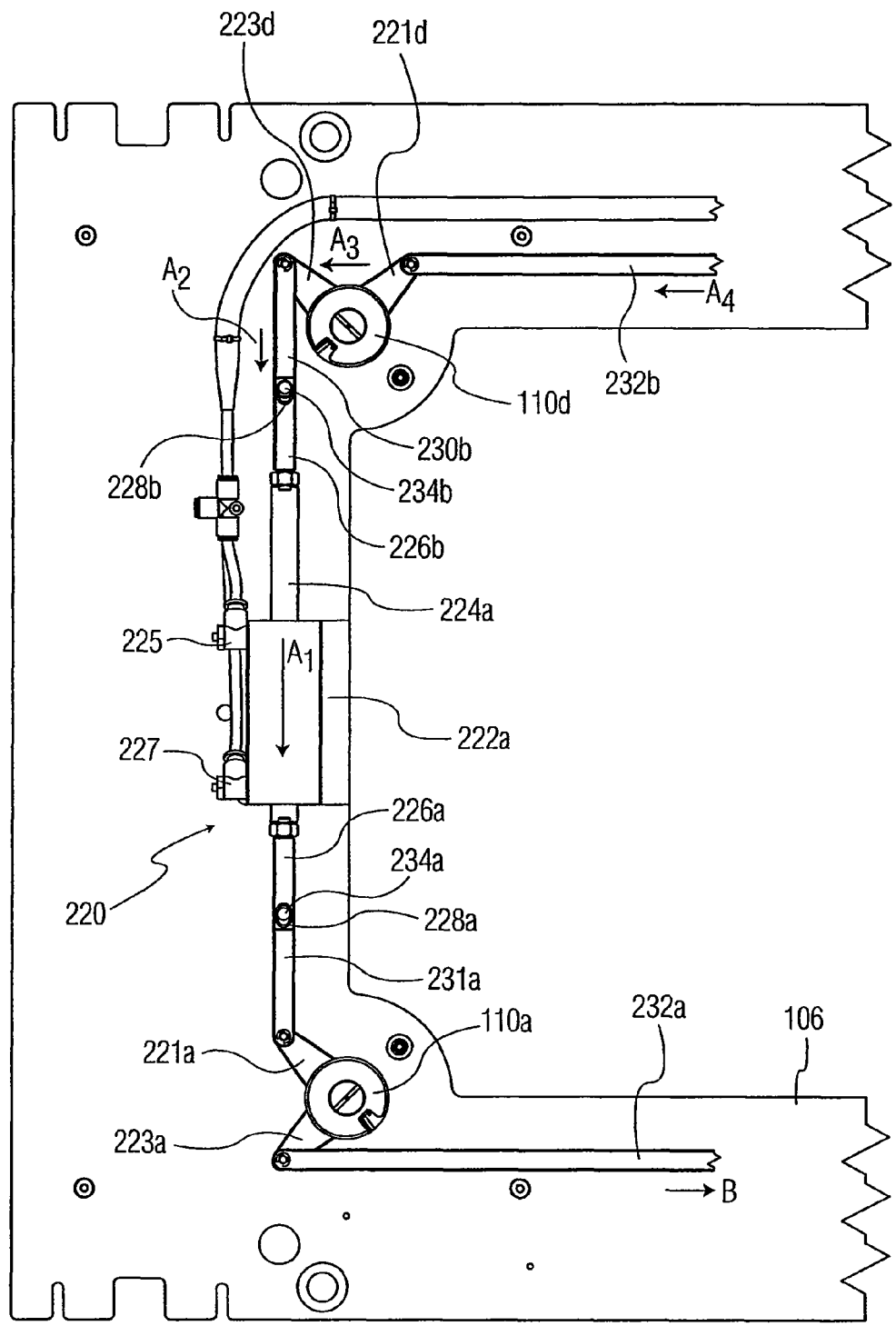
FIG. 10B is an expanded top view of one side of the handling apparatus side of the docking apparatus as shown in FIG. 10A.

The undocking procedure works in opposite of the docking procedure. Referring to FIGS. 10A and 10B, the actuator assembly 220 is shown at the start of an undocking operation. To initiate such, an operator initiates the controller 270 to provide pressurized fluid to inlet valve 225, thereby causing the rod 224a to move in the direction of arrow $A_1$. Simultaneously, the rod 224b also moves in a similar manner, in the opposite direction. As the rod 224a moves, the linkage bar 226b moves with it, and the pivot pin 234b contacts the end of the slot 228b such that the axial motion of the linkage bar 226b is translated to the short linkage 230a as indicated by arrow $A_2$. Movement of short linkage 230a in turn causes the first and second flanges 221d, 223d to rotate with the cam 110d as indicated by arrow $A_3$. Rotation of the first flange 221d causes the long linkage 232b to move as indicated by arrow $A_4$ thereby causing the cam 110c at its opposite end to begin to rotate. Again, the long linkage 232b does not need slots as both ends are connected to respective flanges 221d, 223c which generally move along the same path.

It is noted in FIG. 10B that as rod 224a moves in the direction of arrow $A_1$, it could push gently on the short linkage 231a as slack in the system is taken up, in particular, as the initial axial motion of pivot pin 234a is taken up in the slot 228a of linkage bar 226a. The short linkage 231a and the long linkage 232a are instead pulled by the motion of the rod 224b of linear actuator 222b, as indicated by arrow B, in a manner similar to that described above with respect to actuator 222a. In either the docking or undocking operations, each of the linkages 230, 231 and 232 will be pulled and not pushed. For example, in the docking operation, the long linkage 232a is pulled by actuator 222a and in the undocking operation, the long linkage 232a is instead pulled by the actuator 222b. Again, even with a single actuator, the actuator 222 will be pulling each of the linkages and not pushing.

Figure 11A:
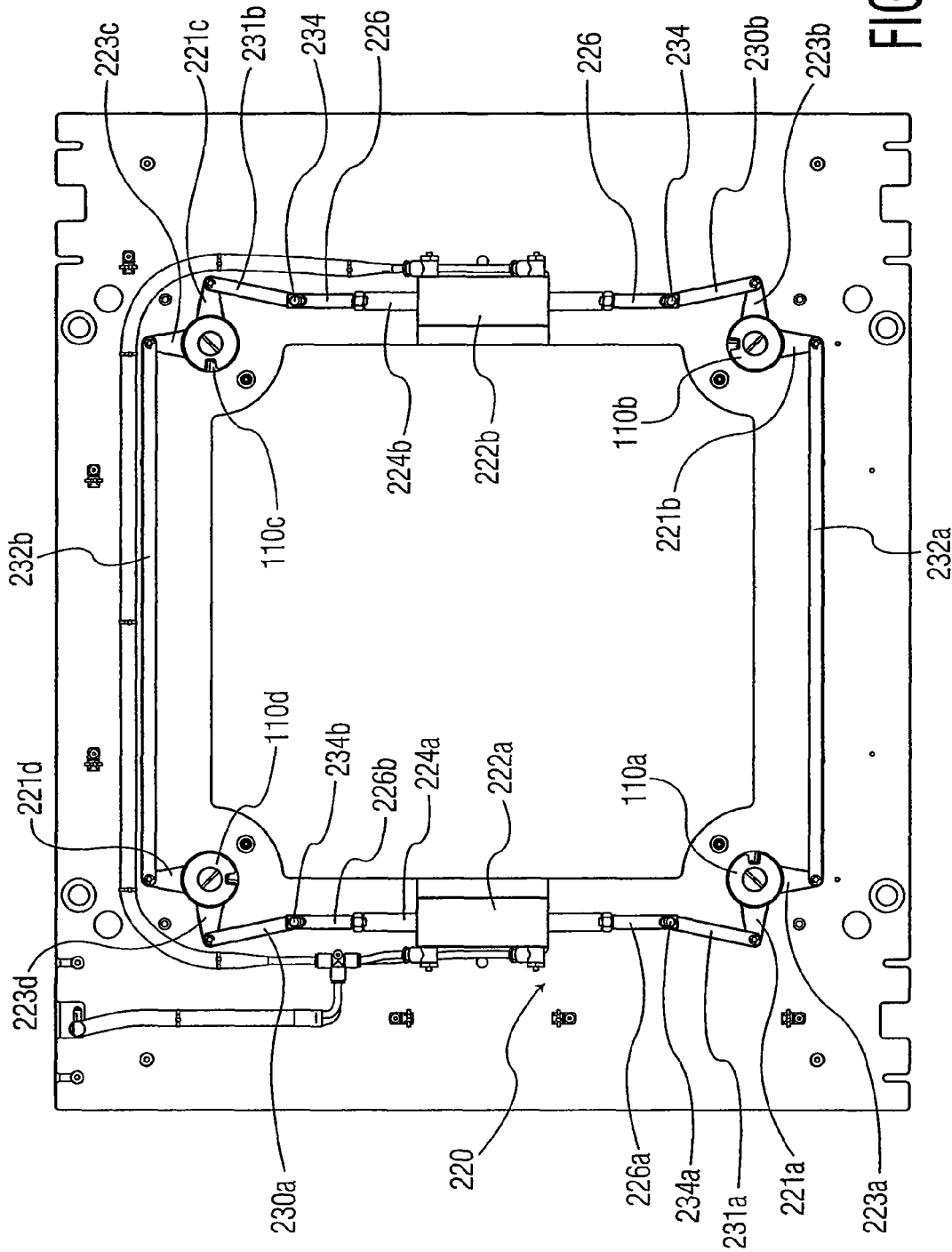
FIG. 11A is a top plan view of the handling apparatus side of a docking apparatus in mid travel from the docked position to the undocked position.
Figure 11B:
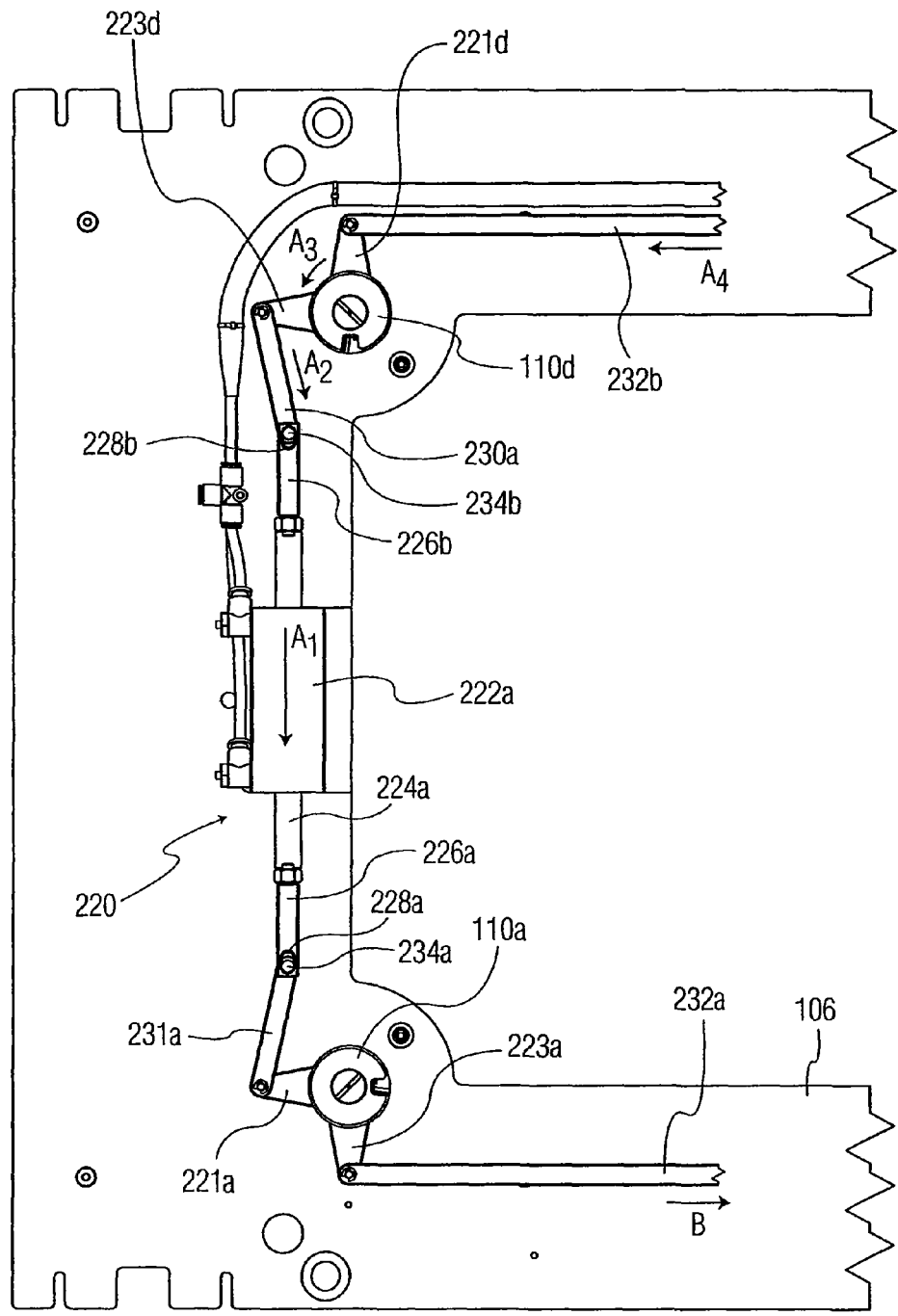
FIG. 11B is an expanded top view of one side of the handling apparatus side of the docking apparatus as shown in FIG. 11A.
Figure 12A:
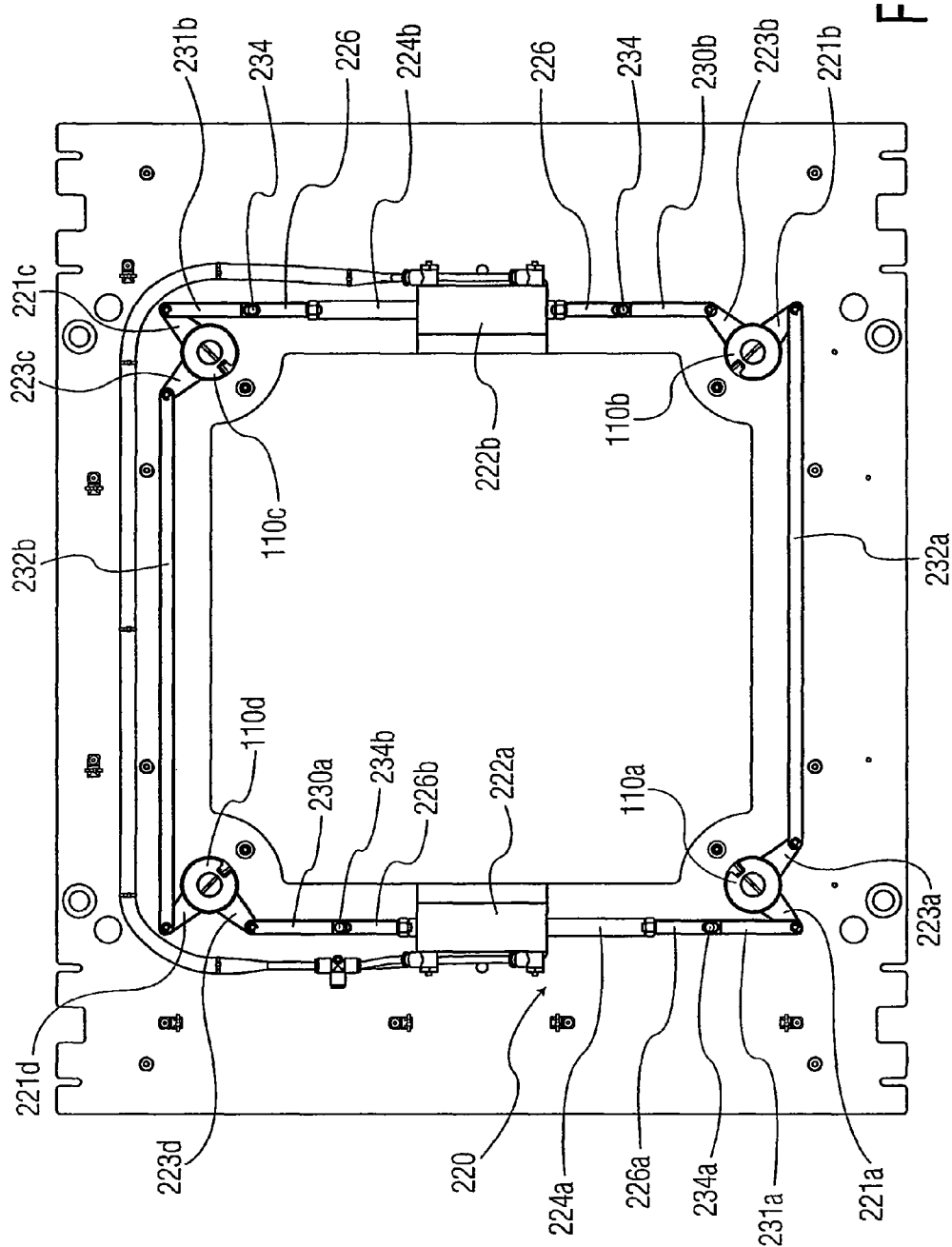
FIG. 12A is a top plan view of the handling apparatus side of a docking apparatus after it has just arrived at the docked position.
Figure 12B:
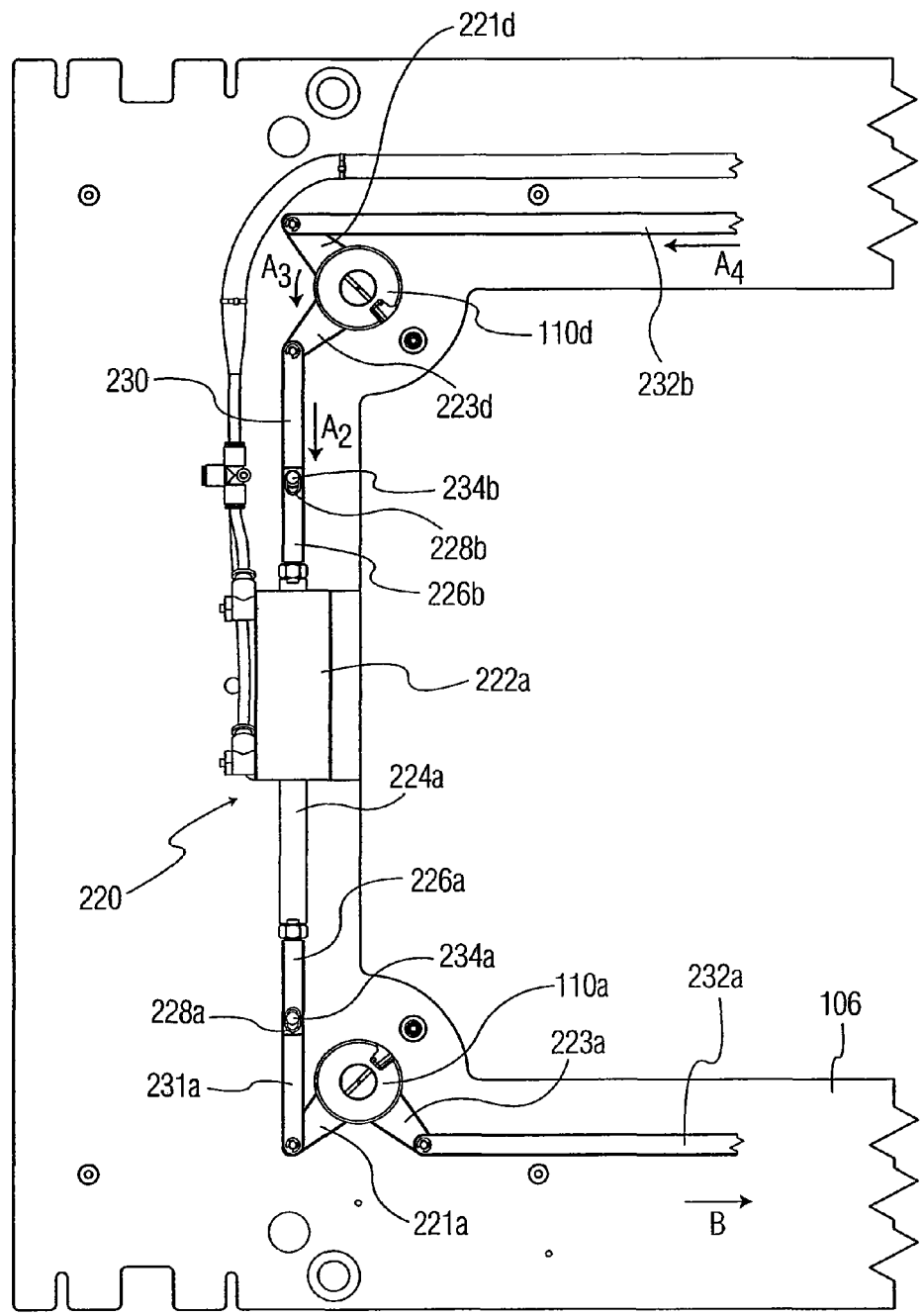
FIG. 12B is an expanded top view of one side of the handling apparatus side of the docking apparatus as shown in FIG. 12A.

FIGS. 11A and 11B illustrate the actuator assembly 220 in mid travel from the docked position to the undocked position and FIGS. 12A and 12B illustrated the actuator assembly 220 after it has just arrived at the docked position. The operation is again similar to the docking operation, with these figures illustrate the relative positions of the linkages and the pivot pins 234 within the slots 228. Thus, as previously stated, all linkages remain desirably and advantageously in tension rather than compression.

Although illustrated and described herein with reference to certain specific embodiments, the present invention is nevertheless not intended to be limited to the details shown. Rather, various modifications may be made in the details within the scope and range of equivalence of the claims and without departing from the spirit of the invention.

What is claimed:

1. A system for docking an electronic test head with a handling apparatus, comprising:
   an assembly for bringing together said electronic test head with said handling apparatus during a docking operation and for separating said electronic test head from said handling apparatus during an undocking operation;
   a mechanism for operating said assembly, the mechanism including at least two cams situated on one of said test head and said handling apparatus for operating said assembly;
   at least one actuator for operating said mechanism; and
   a linkage assembly, including at least a first linkage member and a second linkage member, extending between the at least two cams, wherein the actuator mechanism is operable in said docking operation and in said undocking operation, and said first linkage member and said second linkage member of the linkage assembly are both moved in a common direction during the docking operation and are both moved opposite to the common direction during the undocking operation via a pulling tension without a pushing tension during both the docking operation and the undocking operation, wherein said first linkage member slides relative to said second linkage member during one of said docking operation and said undocking operation, and said second linkage member slides relative to said first linkage member during another of said docking operation and said undocking operation.

2. The system of claim 1 wherein the at least one actuator includes a handle associated with one of the cams and configured to operate the cam in the docking and undocking operations.

3. The system of claim 1 wherein the at least one actuator is a fluid or electrically actuated linear or rotary actuator.

4. The system of claim 1 comprising at least two actuators, each of which is a fluid or electrically actuated linear or rotary actuator.

5. The system of claim 1 wherein the at least one actuator is a fluid actuator and a controller controls the flow of fluid from a fluid source to the fluid actuator.

6. The system of claim 5 wherein the controller is configured to prevent loss of fluid from the fluid actuator upon the loss of power or fluid supply from the fluid source.

7. The system of claim 5 wherein the fluid actuator is a double acting cylinder and the controller is configured to supply fluid to a first side of the double acting cylinder during the docking operation and to supply fluid to an opposite side of the double acting cylinder during the undocking operation.

8. The system of claim 1 wherein the at least one actuator is a linear actuator with a rod and at least one of the linkage members is a first linkage bar connected to a first end of the rod.

9. The system of claim 8 wherein the first linkage bar includes at least one elongated slot which receives a pivot pin pivotally engaging one of the other linkage members.

10. The system of claim 9 wherein a second linkage bar having an elongated slot is connected to a second end of the rod.

11. The system of claim 8 wherein the linear actuator is fixed relative to the one of said test head and said handling apparatus the at least two cams are situated on.

12. The system of claim 8 wherein the linear actuator is fixed within a recess.

13. The system of claim 1 wherein each cam includes at least one flange extending therefrom with at least one linkage member pivotally connected thereto.

14. The system of claim 1 wherein the linkage assembly is connected with the cams in a closed loop.

15. The system of claim 14 wherein the at least one actuator is a linear actuator positioned within the closed loop and connected on each end thereof to a respective one of the linkage members.

16. The system of claim 15 wherein the linear actuator is fixed in position and the linkage members are configured to provide a range of pivotal and axial freedom as the actuator is operated in a direction toward the respective linkage member.

17. The system of claim 15 wherein the linear actuator is configured to pull each of the linkage members in a first direction during the docking operation and to pull each of the linkage members in the second direction during the undocking operation.

18. The system of claim 14 wherein the at least one actuator is a pair of first and second linear actuators positioned within the closed loop, each linear actuator connected on each end thereof to a respective one of the linkage members.

19. The system of claim 18 wherein the first linear actuator is configured to pull a first subset of the linkage members in a first direction during the docking operation and the second linear actuator is configured to pull the remainder of the linkage members in the first direction during the docking operation and wherein the second linear actuator is configured to pull the first subset of the linkage members in the second direction during the undocking operation and the first linear actuator is configured to pull the remainder of the linkage members in the second direction during the undocking operation.

20. The system of claim 18 wherein the first linear actuator is configured to pull each of the linkage members in a first direction during the docking operation and the second linear actuator is configured to pull each of the linkage members in the second direction during the undocking operation.

* * * * *